US008077152B2

(12) United States Patent
Wohlgenannt et al.

(10) Patent No.: US 8,077,152 B2
(45) Date of Patent: Dec. 13, 2011

(54) MAGNETO RESISTIVE ELEMENTS AND METHODS FOR MANUFACTURE AND USE OF SAME

(75) Inventors: Markus Wohlgenannt, Iowa City, IA (US); Thomas Francis, Dubuque, IA (US); Ömer Mermer, Iowa City, IA (US); Govindarajan Veeraraghavan, Iowa City, IA (US)

(73) Assignee: University of Iowa Research Foundation, Iowa City, IA (US)

( * ) Notice: Subject to any disclaimer, the term of this patent is extended or adjusted under 35 U.S.C. 154(b) by 2037 days.

(21) Appl. No.: 10/966,675

(22) Filed: Oct. 15, 2004

(65) Prior Publication Data

US 2006/0091991 A1    May 4, 2006

(51) Int. Cl.
*G06F 3/041* (2006.01)
(52) U.S. Cl. .......................... 345/173; 345/179; 324/244
(58) Field of Classification Search .............. 345/76–83, 345/173, 179; 324/200, 244, 248, 207.11, 324/207.13, 207.21
See application file for complete search history.

(56) References Cited

U.S. PATENT DOCUMENTS

| | | | | |
|---|---|---|---|---|
| 4,532,600 | A | * | 7/1985 | Mihara et al. .................. 702/145 |
| 5,049,809 | A | * | 9/1991 | Wakatsuki et al. ........ 324/117 R |
| 5,444,579 | A | * | 8/1995 | Klein et al. ...................... 360/67 |
| 5,966,274 | A | * | 10/1999 | Suzuki ........................... 360/317 |
| 5,986,840 | A | * | 11/1999 | Tada et al. ....................... 360/67 |
| 6,081,409 | A | * | 6/2000 | Hughbanks et al. ........... 360/128 |
| 6,580,212 | B2 | | 6/2003 | Friend ............................ 313/504 |
| 6,621,100 | B2 | | 9/2003 | Epstein et al. |
| 6,635,990 | B1 | | 10/2003 | Pichler ........................... 313/527 |
| 6,693,611 | B1 | | 2/2004 | Burroughes ..................... 345/83 |
| 6,724,140 | B2 | | 4/2004 | Araki ............................. 313/504 |
| 6,788,052 | B2 | | 9/2004 | Endo et al. ..................... 324/252 |
| 6,791,792 | B2 | | 9/2004 | Takahashi ...................... 360/112 |
| 6,795,263 | B2 | | 9/2004 | Kuroe et al. ..................... 360/66 |
| 6,876,574 | B2 | | 4/2005 | Giebeler et al. |
| 7,205,564 | B2 | | 4/2007 | Kajiyama |
| 7,236,160 | B2 | * | 6/2007 | Kong ............................. 345/173 |
| 7,248,446 | B2 | | 7/2007 | Granstrom |
| 7,250,940 | B2 | * | 7/2007 | Jayanetti et al. .............. 345/173 |
| 2003/0112564 | A1 | | 6/2003 | Granstrom ............... 360/324.12 |
| 2003/0122796 | A1 | * | 7/2003 | Kong ............................. 345/173 |
| 2004/0075093 | A1 | | 4/2004 | Arai et al. ........................ 257/66 |

(Continued)

FOREIGN PATENT DOCUMENTS

WO    WO 2004023574    3/2004

(Continued)

OTHER PUBLICATIONS

O. Mermer et al., Weak Localization and Antilocalization in Semiconducting Polymer Sandwich Devices, Los Alamos National Laboratory, pp. 1-5; Dec. 8, 2003.

(Continued)

*Primary Examiner* — Kimnhung Nguyen
(74) *Attorney, Agent, or Firm* — Ballard Spahr LLP

(57) ABSTRACT

The instant disclosure provides and describes a magneto resistive element comprised of a first electrode; a second electrode; and a semi conductive/conductive organic layer disposed between the first and second electrodes, wherein the magneto resistive element has a predetermined resistance (R). The magneto resistive elements provide a magneto resistive response when influenced by an applied magnetic field. The magneto resistive elements can be integrated into a variety of systems including, without limitation, magnetic field detection systems and display devices.

14 Claims, 19 Drawing Sheets

U.S. PATENT DOCUMENTS

| | | | |
|---|---|---|---|
| 2004/0178325 A1* | 9/2004 | Forrest et al. | 250/214 R |
| 2004/0190105 A1 | 9/2004 | Bussmann et al. | 359/248 |
| 2005/0012716 A1* | 1/2005 | Mikulin et al. | 345/163 |
| 2005/0140662 A1* | 6/2005 | Jayanetti et al. | 345/174 |
| 2006/0007171 A1* | 1/2006 | Burdi et al. | 345/173 |
| 2006/0262099 A1* | 11/2006 | Destura et al. | 345/173 |
| 2007/0082230 A1 | 4/2007 | Shi et al. | |

FOREIGN PATENT DOCUMENTS

| | | |
|---|---|---|
| WO | WO 2006/044715 | 4/2006 |

OTHER PUBLICATIONS

R. Günter et al., Conjugated Polyfluorene/Polyaniline Block Copolymers—Improved Synthesis and Nanostructure Formation, Thin Solid Films, 1-6, 2002.

Gross et al., Improving the Performance of Doped Conjugated Polymers for Use in Organic Light-Emitting Diodes, Nature, pp. 661-665, Jun. 8, 2000.

John Wilkinson et al., Evidence for Charge-Carrier Mediated Magnetic-Field Modulation of Electroluminescence in Organic Light-Emitting Diodes, Applied Physics Letters, pp. 111109-1- 111109-3, Mar. 8, 2005.

Albert Davis et al., Large Magnetic Field Effects in Organic Light Emitting Diodes Based on Tris(8-hydroxyquinoline aluminum) ($Alq_3$)/ N,N'-Di(naphthalene-1-yl)-N, N' diphenyl-benzidine (NPB) bilayers, J. Vac. Sci. Technol. A 22(4), pp. 1885-1891, Jul. 23, 2004.

Y. Yoshida, et al., Magnetic Field Effect as a Test for Effectiveness of the Light Emission at the Recombination of Injected Charge Carriers in Polymeric Semiconductors, Department of Electrical Engineering, Osaka University, pp. 19-24, (2005).

Jan Kalinowski, et al., Magnetic Field Effects on Emission and Current in $Alq_3$-Based Electroluminescent Diodes, Chemical Physics Letters 380 Oct. 9, 2003, 710-715.

G. Salis, et al., Hysteretic Electroluminescence in Organic Light-Emitting Diodes for Spin Injection, Physical Review, Aug. 12, 2004, pp. 085203-1-085203-6.

M. Cocchi, et al., Magnetic Field Effects on Organic Electrophosphorescence, The American Physical Society, Nov. 3, 2004, pp. 205303-1-205303-7.

Michael Freemantle, Polymer Oled Efficiency Boost, Chemical & Engineering News, May 3, 2004, p. 9.

Jing Shi, Researchers Put A Spin on Electronics, www.electroline.com, May 18, 2004, pp. 1-4.

O. Worsfold, et al., Langmuir and Langmuir-Blodgett (LB) Film Properties of Poly(9,9-Dioctylfluorene), Materials Science & Engineering (2003), pp. 541-544.

A.H. Davis, et al., Organic Luminescent Devices and Magnetoelectronics, Journal of Applied Physics, vol. 93, No. 10, May 15, 2003, pp. 7358-7360.

O. Mermer et al., Large Magnetoresistance at Room-Temperature in Small-Molecular-Weight Organic Semiconductor Sandwich Devices, Solid State Communications, Mar. 21, 2005, pp. 631-636.

T.L. Francis et al., Large Magnetoresistance at Room Temperature in Semiconducting Polymer Sandwich Devices, New Journal of Physics 6, Nov. 30, 2004 pp. 1-8.

O. Mermer, et al., Magnetoresistance Study in Semiconducting Polymer Thin Film Devices: Evidence of Weak Localization, University of Iowa, Mar. 23, 2004, pp. 1-10.

A. L. Buchachenko and E. L. Frankevich, Chemical Generation and Reception of Radio- and Microwaves; New York: VCH Publishers, Inc., 1994; pp. 25-30.

Francis, et al., "Large magnetoresistance at room-temperature in semiconducting polymer sandwich devices"; available at http://arxiv.org/PS_cache/cond-mat/pdf/0409/0409753v1.pdf (Feb. 2, 2008).

Frankevich, et al., "Photoconductivity of poly(2,5-diheptyloxy-p-phenylene vinylene) in the air atmosphere: Magnetic-field effect and mechanism of generation and recombination of charge carriers"; Phys. Rev. B 53(8 (1996): 4498-4508.

Frankevich, et al., "Polaron-pair generation in poly(phenylene vinylenes)"; Phys. Rev. B Condens. Matter, 1992; 46 (15): 9320-24.

Kalinowski, Jan, "Electroluminescence in organics"; J. Phys. D.: Appl. Phys. 32 (1999) R-179-R250.

M. Pope and C.E. Swenberg, Electronic Processes in Organic Crystals and Polymers; New York: Oxford University Press, Inc., 1999; pp. 139-157.

Xiong, et al., "Giant magnetoresistance in organic spin-valves"; Nature, Feb. 26, 2004; 427: 821-824.

International Search Report and Written Opinion of the International Searching Authority, for International Application No. PCT/US05/37111 (inactive) (mailed Jan. 2, 2008).

* cited by examiner

MAGNETO RESISTIVE ELEMENTS AND METHODS FOR MANUFACTURE AND USE OF SAME

FIELD OF THE INVENTION

The present invention relates generally to magneto resistive devices, systems comprising one or more magneto resistive devices and methods for the use and manufacture thereof. More particularly, the present invention relates to magneto resistive elements having a semi-conductive/conductive organic layer therein.

BACKGROUND OF THE INVENTION

The phenomenon of magneto resistance (MR) refers to the property of some materials that the electrical resistance, R, depends on the applied magnetic field, B. There is a growing family of MR phenomena. "Classical MR" which varies as $B^2$ is too small for practical application. "Anisotropic MR" (AMR) is a property of ferromagnetic metals such as iron. Its magnitude is generally below 1%. "Colossal MR" (CMR) is exhibited by ferromagnetic oxides and occurs near the Curie-point. There are two severe problems of CMR with respect to application: first, it occurs only at unpractical large B and, second, at low temperatures. The current hard-disk drive technology uses the giant magneto resistance (GMR) effect which occurs in thin film multilayers of magnetic and normal metals. Large negative changes in resistance ($\approx$10%) are seen in small fields, $B \approx 10$ mT. Concurrently, organic conjugated materials have also been developed and used to manufacture promising devices such as organic light emitting diodes (OLEDs), photovoltaic cells and field effect transistors.

Many of the currently known magneto resistive effects require measurements at very low temperatures and very high magnetic fields. These extreme temperature and magnetic field conditions have proven to be prohibitive to the development of economically and commercially useful applications of magneto resistive organic materials, data storage and retrieval and quantum information applications. As such, there is still a need in the art for the discovery and development of organic semi conductive materials and devices that can exhibit weak field magneto resistive properties at least substantially independent of specific temperature and thus enabling their use in a variety of current and future magneto resistance technologies.

SUMMARY OF THE INVENTION

Among other aspects, the present invention is based, at least in part, on organic semi conductive materials and devices comprising same that exhibit weak field magneto resistive effects at least substantially independent of surrounding temperature profiles.

In one embodiment, the present invention provides a magneto resistive element comprised of a first electrode, a second electrode, and a semi conductive organic layer disposed between the first and second electrodes. In this aspect, the magneto resistive element has a predetermined resistance (R).

In an alternative embodiment, the present invention provides a thin film magneto resistive detection system, comprising a magneto resistive element, as exemplified in the embodiment described above, having a predetermined resistance (R). A voltage source is in operative communication with the first and second electrodes of the magneto resistive element and provides a predetermined voltage (V) and a predetermined current (I) across the semi conductive organic layer of the magneto resistive element. A means for applying an external magnetic field of a predetermined strength to the semi conductive organic layer of the magneto resistive element is provided such that the resistance of the magneto resistive element is changed from the predetermined resistance (R). Further, a means for detecting the change in the resistance of the magneto resistive element from the predetermined resistance (R) is provided within the system.

In a third embodiment, the present invention provides a system for detecting a magnetic field that comprises a magneto resistive element as set forth above, a voltage source in operative communication with the first and second electrodes of the magneto resistive element, which provides a predetermined voltage (V) and a predetermined current (I) across the semi conductive organic layer of the magneto resistive element. The system also comprises a means for detecting the change in the resistance of the magneto resistive element from the predetermined resistance (R).

In a fourth alternative embodiment, the present invention provides a method for detecting magneto resistance that comprises providing a magneto resistive element as described above having a predetermined resistance(R), applying a predetermined voltage (V) and a predetermined current (I) across the semi conductive organic layer of the magneto resistive element from a voltage source, and applying an external magnetic field having a predetermined strength to the semi conductive organic layer of the magneto resistive element such that the resistance of the magneto resistive element is changed from the predetermined resistance (R). The method further includes detecting the change in the resistance of the magneto resistive element from the predetermined resistance (R).

In a fifth embodiment, the present invention provides a thin film magneto resistive detection system that comprises a plurality of magneto resistive elements (each resistive element having a predetermined resistance (R)) disposed on a substrate. Each magneto resistive element is in communication with a voltage source supplying a predetermined voltage (V) and a predetermined current (I) across the semi conductive organic layer of the magneto resistive elements. The system further comprises a means for applying an external magnetic field of a predetermined strength to the semi conductive organic layer of at least one of the magneto resistive elements such that the resistance of the at least one of the magneto resistive elements is changed from the predetermined resistance (R) and a means for detecting the change in the resistance of the at least one of the magneto resistive elements from the predetermined resistance (R).

In a sixth embodiment, the present invention provides a display device that comprises a plurality of magneto resistive elements as described herein disposed onto a substrate; a voltage source in operative communication with the first and second electrode of at least one of the plurality of magneto resistive elements, the voltage source providing a predetermined voltage (V) and a predetermined current (I) across the semi conductive organic layer of each magneto resistive elements. This aspect of the invention also comprises a means for detecting a change in the resistance of the at least one of the plurality of magneto resistive elements from the predetermined resistance (R).

Additional aspects of the invention will be set forth in part in the description which follows, and in part will be obvious from the description, or may be learned by practice of the invention. Additional aspects of the invention, aside from those disclosed herein, will be realized and attained by means of the elements and combinations particularly pointed out in the appended claims. It is to be understood that both the foregoing general description and the following detailed description and figures are exemplary and explanatory only and are not restrictive of the invention, as claimed.

BRIEF DESCRIPTION OF THE FIGURES

The accompanying drawings, which are incorporated in and constitute a part of this specification, illustrate several embodiments of the invention and together with the description, serve to explain the principles of the invention.

DETAILED DESCRIPTION OF THE INVENTION

Figure 1:
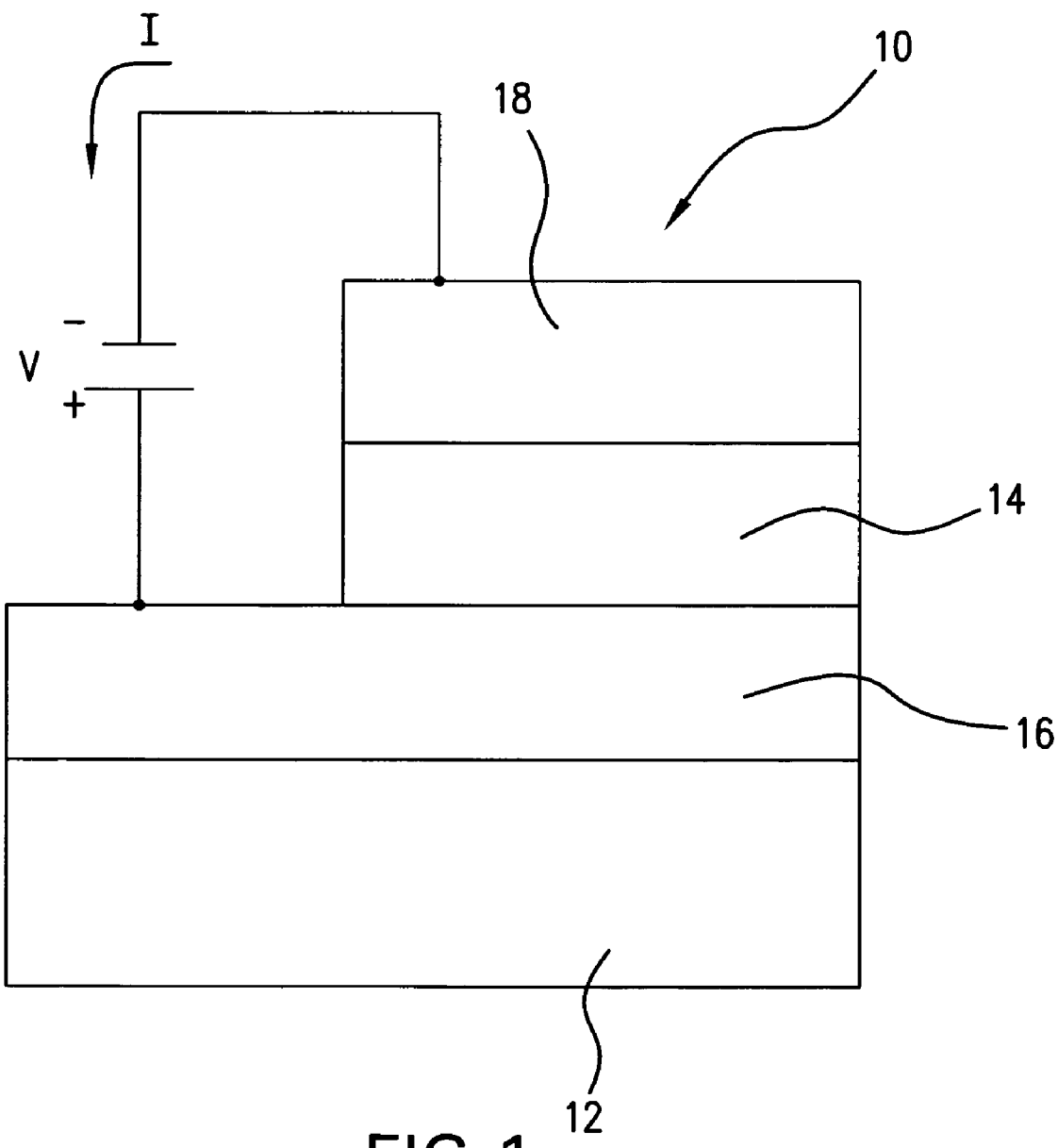
FIG. 1 is a cross-sectional schematic view of an organic magneto resistance device 10 according to one aspect of the instant invention. Illustrated therein is a substrate 12, a first electrode 16, a semi conductive organic layer 14, and a second electrode 18. In addition, the voltage source and device current (I) is also shown.

The present invention may be understood more readily by reference to the following detailed description of preferred embodiments of the invention and the Examples included herein and to the Figures and their previous and following description. To that end, the present invention is described in detail with reference to FIGS. 1-26 in which like numerals indicate like components throughout the several views. It is also to be understood that this invention is not limited to specific synthetic methods, specific embodiments, or to particular devices, as such may, of course, vary. It is also to be understood that the terminology used herein is for the purpose of describing particular embodiments only and is not intended to be limiting.

It must also be noted that, as used in the specification and the appended claims, the singular forms "a," "an" and "the" include plural referents unless the context clearly dictates otherwise.

Ranges may be expressed herein as from "about" one particular value, and/or to "about" another particular value. When such a range is expressed, another embodiment includes—from the one particular value and/or to the other particular value. Similarly, when values are expressed as approximations, by use of the antecedent "about," it will be understood that the particular value forms another embodiment.

In this specification and in the claims which follow, reference will be made to a number of terms which shall be defined to have the following meanings:

As used herein, the terms "optional" or "optionally" mean that the subsequently described event or circumstance may or may not occur, and that the description includes instances where said event or circumstance occurs and instances where it does not.

As used herein, by use of the term "effective," "effective amount," or "conditions effective to" it is meant that such amount or condition is capable of performing the function of the compound, device or property for which an effective amount is expressed. As will be pointed out below, the exact amount or condition required will vary from one embodiment to another, depending on recognized variables such as the compounds employed and the processing conditions observed. Thus, it is not always possible to specify an exact "effective amount" or "condition effective to." However, it should be understood that an appropriate effective amount or effective condition will be readily determined by one of ordinary skill in the art using only routine experimentation.

As used herein, it should be understood that the term or phrase semi-conductive refers in one aspect to materials having characteristics of electrical conductivity that is relatively greater than an insulator but that is also relatively less than true conductors. Alternatively, it should also be understood that as used herein a semi-conductive material can be doped or otherwise chemically modified in order to provide electrical conductivity that is similar or equivalent to that of a true conductive material. Therefore, by use of the term semiconductive materials, it should be understood that such materials are not necessarily exclusive of materials having true conductive electric characteristics.

The present invention is based, at least in part, on organic semi conductive materials and devices comprising same that exhibit weak field magneto resistive effects at least substantially independent of surrounding temperature profiles. As such, these organic semi conductive materials can effectively be used in the manufacture of a magneto resistive element for use in a variety of applications. As one of ordinary skill in the art will appreciate, a magneto resistive (MR) element exhibits a change in its electrical resistance (R) as a function of an external magnetic field. This property enables an MR element to function as a magnetic field sensor suitable for use in a variety of applications. Several of the organic semi conductive materials useful in this instant invention have been previously known for their viable use in the manufacture of organic light emitting diode devices (OLED's). Therefore, in one embodiment, the instant invention provides, for example, the merged functionalities of an organic light emitting diode and a magneto resistive element to be combined into a single light emitting device having magneto resistive properties.

With specific reference to FIG. 1, a cross-sectional view of a basic magneto resistive element 10 in accordance with the present invention is illustrated. The magneto resistive element 10 includes an optional substrate 12, a first or bottom electrode 16, a semi conductive organic layer 14, and a second or top electrode 18. The semi conductive organic layer 14 is disposed between the first and second electrodes 16, 18.

The first or bottom electrode 16 can be comprised of either magnetic or a non magnetic material, or even a mixture of magnetic and nonmagnetic materials. A listing of non-magnetic materials suitable for use as an electrode component include, without limitation, any one of the alkali metals, e.g., Lithium (Li) and Potassium (K), and alkaline earth metals, e.g., Magnesium (Mg) and Calcium (Ca). Additionally, materials such as Gold (Au), Aluminum (Al), tin-oxide (TO), indium-tin-oxide (ITO) and indium-zinc oxide can also function as suitable bottom electrode materials. In still another aspect, the electrodes can comprise conductive organic materials, such as electrodes made from or comprising conducting polymers, such as (poly(3,4-ethylenedioxythiophene)-poly (styrenesulfonate) commonly referred to as PEDOT-PSS. Additionally, half or partial metallic electrode materials such as a manganite, cobaltite, and or ferrite can also be used in accordance with the present invention. For example, the electrode can comprise a Lanthanum-Strontium-Manganite (LSM), Lanthanum Strontium Cobaltite Ferrite (LSCF), Samarium Strontium Cobaltite (SSC), Lanthanum Calcium Manganite (LCM), and Lanthanum Calcium Cobaltite Ferrite (LCCF). To that end, it should be appreciated that the bottom electrode can be formed of an alloy or combination of any two or more suitable materials selected to achieve both a desired stability and desired electrical properties. Further, said combinations can be deposited as a homogenous mixture or as a plurality of layers superimposed upon each other.

As illustrated in FIG. 1, the bottom electrode can be deposited onto an optional substrate material 12. The substrate can be comprised of any material known to be suitable for use as a substrate in thin film electronic component device applications, such as those commonly used in connection with organic light emitting diode devices (OLED). Examples of suitable classes of substrate materials include, without limitation, glasses, ceramics or plastic plate materials, paper, textiles or crystalline and non-crystaline semiconductor material, such as Silicon. Additionally, a suitable substrate material can, if desired, have specified heat resistance, dimensional stability, solvent resistance, electrical insulating properties, processibility, low air permeability, and/or low moisture absorption. Specific examples of suitable substrate materials can include, without limitation, polyethylene terephthalate, polybutylene terephthalate, polyethylene naphthalate, polystyrene, polycarbonate, polyether sulfone, polyarylate, allyl diglycol carbonate, and polyimides or any combination thereof. In still another aspect, the substrate can be a flexible material.

The bottom electrode, as described above, can be one or more layers of a suitable electrode material or combination of materials deposited upon the substrate 12. The bottom electrode layer or layers can be deposited or formed by any conventional method known in the art, including without limitation vacuum evaporation, sputtering, dip coating, spin coating, casting, bar coating, roll coating, and ion plating. To that end, in one embodiment it is preferred that the electrode layer or layers be continuous. However, there can be particular applications where a non-continuous electrode layer is desired. Therefore it is further contemplated by the invention that the bottom electrode can, if desired, be a non-continuous layer.

Semi conductive organic layer 14 is comprised of a pi-conjugated organic compound or mixture of compounds. These pi-conjugated organic compounds can be crystalline or non-crystalline compounds, depending on the particular properties desired. In one aspect, the pi-conjugated organic compound is a pi-conjugated polymeric material. One suitable class of polymeric materials are the polyfluorene polymers, such as a poly(9,9-dioctylfluorenyl-2,7-diyl) polymer end capped with N,N-Bis(4-methylphenyl)-4-aniline, commercially available from American Dye Sources. Additional semi conductive organic polymeric materials include regio-regular poly(3-hexylthiophene-2,5-diyl) and regio-random poly(3-octylthiophene-2,5-diyl), both of which are commercially available from Sigma-Aldrich. In an alternative aspect, the pi-conjugated organic material can be selected from the class of pi-conjugated organic small molecules, such as aluminum tris-(8-hydroxyquinoline) ($AlQ_3$) and/or pentacene. In still another aspect, the pi-conjugated organic compound can be selected from the class of pi-conjugated semi-condcutive organic oligomers, including for example, oligothiophenes, oligophenyls and oligophenylenevinylene.

The semi conductive organic layer 14 can, in one embodiment, be comprised of a single organic compound as disclosed above. However, it should also be understood that the semi conductive organic layer can also comprise a mixture of any two or more compounds or classes of compounds disclosed above. For example, and without limitation, the semi conductive organic layer can be a mixture of more than one pi-conjugated organic polymer, more than one pi-conjugated organic small molecule or even more than one pi-conjugated organic oligomer. Additionally, in another embodiment, the semi conductive organic layer can be comprised of a mixture of compounds from two or more classes of pi-conjugated compounds discussed above. For example, the semi conductive organic layer can be comprised of a mixture of one or more pi-conjugated polymers and/or one or more pi-conjugated organic small molecules and/or one or more pi-conjugated oligomers.

In order to obtain particularly desired properties, the semi conductive organic materials described above can be used in their pure form, impure form or even mixtures thereof. That is to say, for example, a semi conductive organic material can if desired contain impurities, present unintentionally or by design, which in turn provide desired properties to the resulting MR device. Examples of particular impurities include, without limitation, catalyst, reactants, magnetic material, non-magnetic materials, p-type dopants and n-type dopants and the like. In one specific embodiment, the semi conductive layer is comprised of PFO polymer doped with a minimum concentration of Nickel. These contemplated impurities can be present in any of the organic compounds described herein, including the pi-conjugate organic polymers, pi-conjugated organic small molecules and pi-conjugated organic oligomers. As will be appreciated upon practicing the various aspects of the invention described herein, one of ordinary skill in the art can readily determine which impurity or combination of impurities and in what relative concentration such impurities would be desired through no more than routine experimentation.

The semi conductive organic layer is, in one aspect, deposited as a single continuous layer having an at least substantially uniform morphology. However, in an alternative aspect, the semi conductive organic layer is comprised of a plurality of superimposed homogenous layers. To that end, the semi conductive organic layer 14 is in one aspect, deposited such that it has a thickness in the range of from about 1 nm up to about 200 nm. In another aspect, the semi conductive organic layer is deposited such that it has a thickness in the range of from approximately 20 um to approximately 300 um. As one will appreciate, the semi conductive organic layer can be deposited by any know means including vacuum evaporation, sputtering, dip coating, spin coating, casting, ink-jet printing, bar coating, roll coating, and the like.

It should be understood that the exemplified MR device according to the instant invention can be constructed and arranged to provide any desired initial or idle resistance when not under the influence of an applied magnetic field. To that end, the ideal or optimum choice will depend upon the intended use and the detection method to be employed. Further, the initial or idle resistance can be customizably designed through adjusting film thickness and choice of materials and will be known or readily obtained by one of ordinary skill in the art through no more than routine experimentation.

The second or top electrode 18 can also be comprised of either magnetic or a non magnetic material, or even a mixture of magnetic and nonmagnetic materials. A listing of exemplified non-magnetic materials for use as an electrode component include, without limitation, any one of the alkali metals, e.g., Lithium (Li) and Potassium (K), and alkaline earth metals, e.g., Magnesium (Mg) and Calcium (Ca). Additionally, materials such as Gold (Au), Aluminum (Al), tin-oxide (TO), indium-tin-oxide (ITO) and indium-zinc oxide can also function as suitable bottom electrode materials. In still another aspect, the top electrode can comprise conductive organic materials, such as electrodes made from or comprising conducting polymers, such as (poly(3,4-ethylenedioxythiophene)-poly(styrenesulfonate) commonly referred to as PEDOT-PSS. Additionally, half or partial metallic electrode materials such as a manganite, cobaltite, and or ferrite can also be used in accordance with the present invention. For example, the electrode can comprise a Lanthanum-Strontium-Manganite (LSM), Lanthanum Strontium Cobaltite Ferrite (LSCF), Samarium Strontium Cobaltite (SSC), Lanthanum Calcium Manganite (LCM), and Lanthanum Calcium Cobaltite Ferrite (LCCF). To that end, it should be appreciated that the top electrode can be formed of an alloy or combination of any two or more suitable materials selected to achieve both a desired stability and desired electrical properties. Further, the combinations can be deposited as a homogenous mixture or as a plurality of layers superimposed upon each other.

In another embodiment, the top electrode is comprised of a reflective material that can reflect light, such as a mirror or an optical resonator. Additionally, in another embodiment it is further contemplated by the invention and as will be appreciated by one of ordinary skill in the art, that one or more electrode can be comprised of a transparent material in order to facilitate the passage of light and so as not to reflect light. Accordingly, it should be appreciated that a reflective top electrode can be paired with a transparent bottom electrode such that light emitting from an OLED organic layer disposed there between can reflect off the top electrode and pass through the bottom electrode. Similarly, in another embodiment, the bottom electrode is comprised of a reflective material that can reflect light, such as a mirror or an optical resonator. Accordingly, it should be appreciated that a reflective bottom electrode can be paired with a transparent top electrode such that light emitting from an OLED organic layer disposed there between can reflect off the bottom electrode and pass through the top electrode.

The second or top electrode, as described above, can be one or more layers of a suitable electrode material or combination of materials deposited upon the semi conductive organic layer 14. As such, the top electrode layer or layers can be deposited or formed by any conventional method known in the art, including without limitation vacuum evaporation, sputtering, dip coating, spin coating, casting, ink-jet printing, bar coating, roll coating, ion plating, and the like. To that end, in one embodiment it is preferred that the top electrode layer or layers be continuous. However, as one of ordinary skill in the art will appreciate, there can be particular applications where a non-continuous top electrode layer is desired. Therefore, it is further contemplated by the invention that the top electrode can, if desired, be a non-continuous layer.

It will be appreciated in view of the instant description and upon practicing the present invention that, in another embodiment, the bottom electrode and/or the top electrode can comprise any suitable hard and/or soft magnetic material. In addition the magnetic material can be either an alloy or a composite magnetic material. According to this embodiment, the electrode comprising magnetic material would function to maintain the influence of a magnetic field upon the organic semi conductive layer even after an applied external magnetic field is no longer influencing the semi conductive layer. As such, the use of one or more magnetic electrode materials can allow the MR device to retain a memory of an external magnetic field previously applied to the MR device. The resulting ability to analyze the MR device's retained memory of a previously applied magnetic field's strength and polarity therefore enables an MR device according to the instant invention suitable for use in additional applications such as magnetic data storage and retrieval.

If desired and depending upon the particular end use application, a magneto resistive element according to the instant invention can further comprise additional optional layers such a moisture barrier or sealant layer designed to protect the device from moisture, oxidation, dust particles and the like which can adversely affect the performance and functionality of the device.

In another aspect, the present invention provides a system, comprising a magneto resistive element as described herein, having a first electrode, a second electrode, and a semi conductive organic layer disposed between the first and second electrodes. The magneto resistive element has a predetermined resistance (R). A voltage source is in operative communication with the first and second electrode to provide a predetermined voltage (V) across and a predetermined current (I) through the semi conductive organic layer of the magneto resistive element. A magnetic field source, having an external magnetic field of a predetermined strength, is provided such that the resistance of the magneto-resistive element is changed from the predetermined resistance (R) when the magnetic field source is applied to the semi conductive organic layer. Further, the system also comprises a means for detecting the change in the resistance of the magneto resistive element from the predetermined resistance (R).

Figure 2:
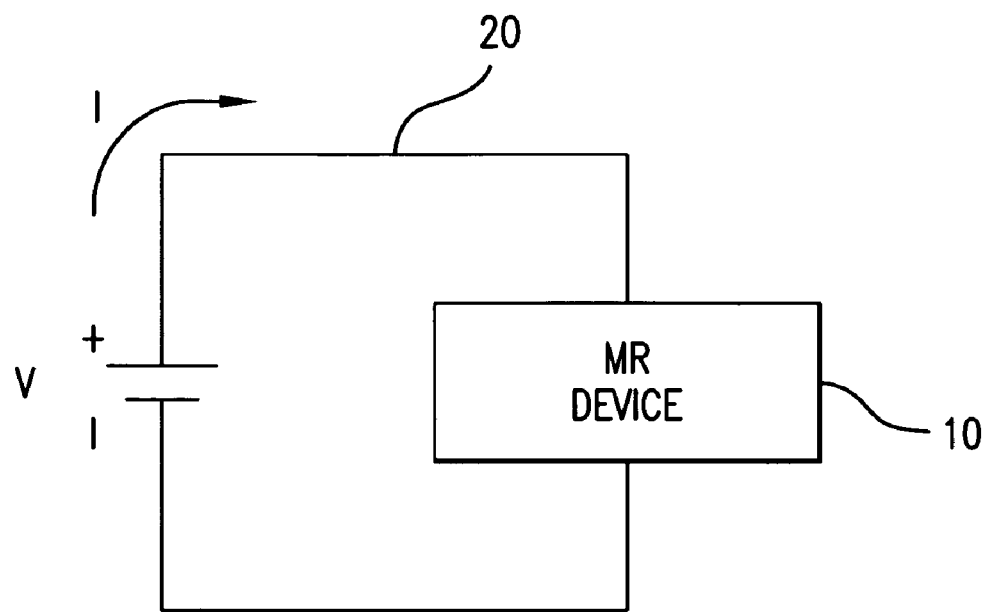
FIG. 2 is a schematic illustration of a circuit 20 comprised of a voltage source V in operative communication with a magneto resistance (MR) device 10 and a current I passing through the circuit.
Figure 3:
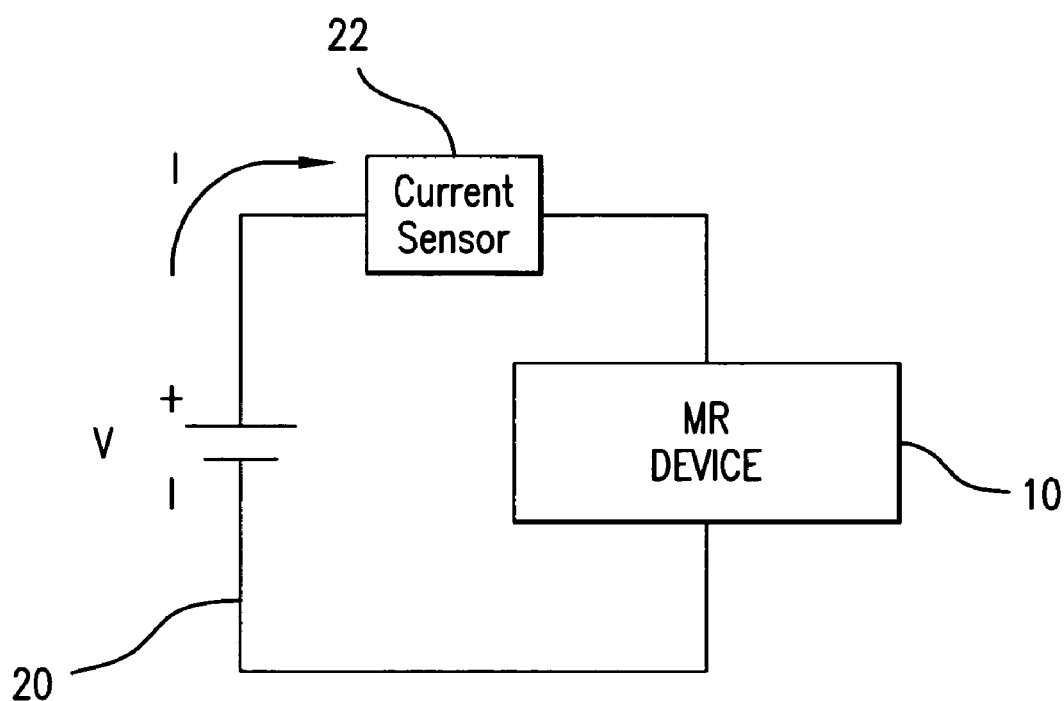
FIG. 3 is a schematic illustration of a circuit 20 comprised of a voltage source V in operative communication with a magneto resistance (MR) device 10 and a current I passing through the circuit. The change in electrical resistance due to the presence of the magnetic field is detected through the current sensor 22 positioned in the circuit 20.

In use, the operation of a system comprising a magneto resistive element as described herein can be further understood with reference to FIGS. 1 through 3. In this example, an integrated circuit 20 is provided having a voltage source (V) and a magneto resistive element or device 10. The magneto resistive element 10 has two electrodes 16, 18 in operable communication with the voltage source V to provide a complete circuit 20. In the absence of an external magnetic field, a predetermined voltage (V) is applied across the device and a predetermined current (I) will flow through the circuit. As will be appreciated by one of ordinary skill in the art, the current (I) is dependent on the resistance (R) of the magneto resistive element (MR). In the presence of an applied external magnetic field, the resistance of the magneto resistive element can either decrease or increase, depending on the materials used, voltage applied and/or the magnetic field applied. If the resistance of the MR device increases, then the current supplied by the voltage source will decrease. If the resistance of the MR device decreases, then the voltage source will supply increased current.

The magneto resistive response obtained by the MR devices of the instant invention can be either negative or positive in value. As illustrated in the following examples and figures relating to same, the direction and magnitude of magneto resistive response can be customized through choice of materials, magnitude of applied voltage and/or magnitude of magnetic field B.

The source or means for providing the external magnetic field is not critical and can be any magnetized material having a magnetic field capable of influencing and altering the resistance of the magneto resistive element to a desired parameter. Thus, the magnetic field can be provided by either a soft or hard magnetic material, or an electromagnet. Suitable examples include, without limitation, magnetic composites, magnetic alloys, magnetic metals, magnetized glass and/or ceramic and the like. To that end, it will be appreciated by one of ordinary skill in the art that optimizing the particular parameters of the magnetic field source will depend, in part, upon the choice of materials used in the magneto resistive device, the desired degree and direction of resistance change in the magneto resistive element and the desired end use application for the magneto resistive element. In one aspect, and without limitation, the strength of the applied or detected magnetic field is typically within the range of 1 to 1000 mT, including such strengths as 10, 50, 100, 200, 300, 400, 500, 600, 700, 800, and 900 mT. To that end, the optimum choice of an external magnetic field will become known or readily obtained by one of ordinary skill in the art through no more then mere routine experimentation.

Figure 11:
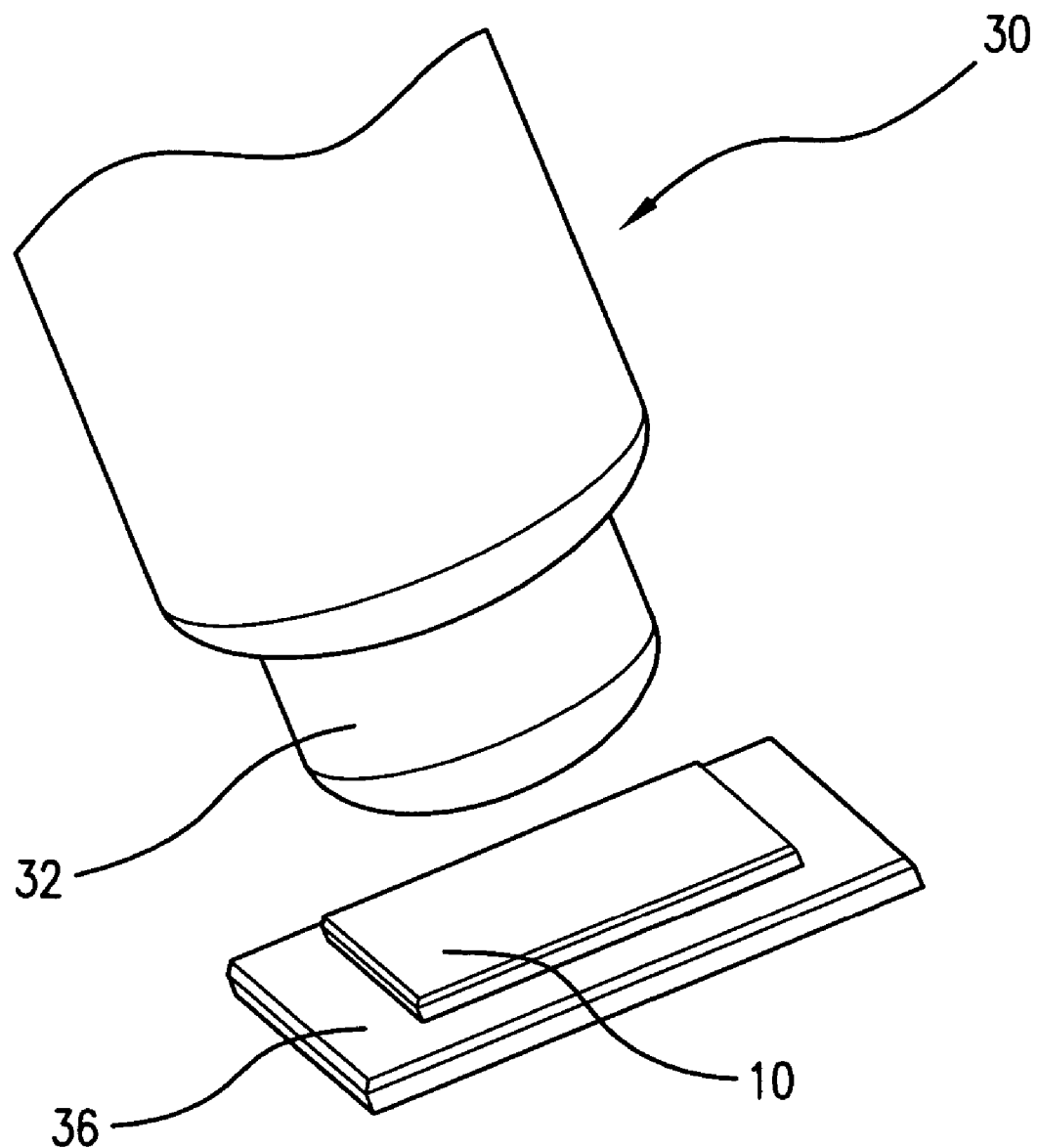
FIG. 11 is a perspective view of an exemplified MR device 10 on a fixture 36 that detects the presence of the magnetic material 32 positioned on a stylus 30.
Figure 12:
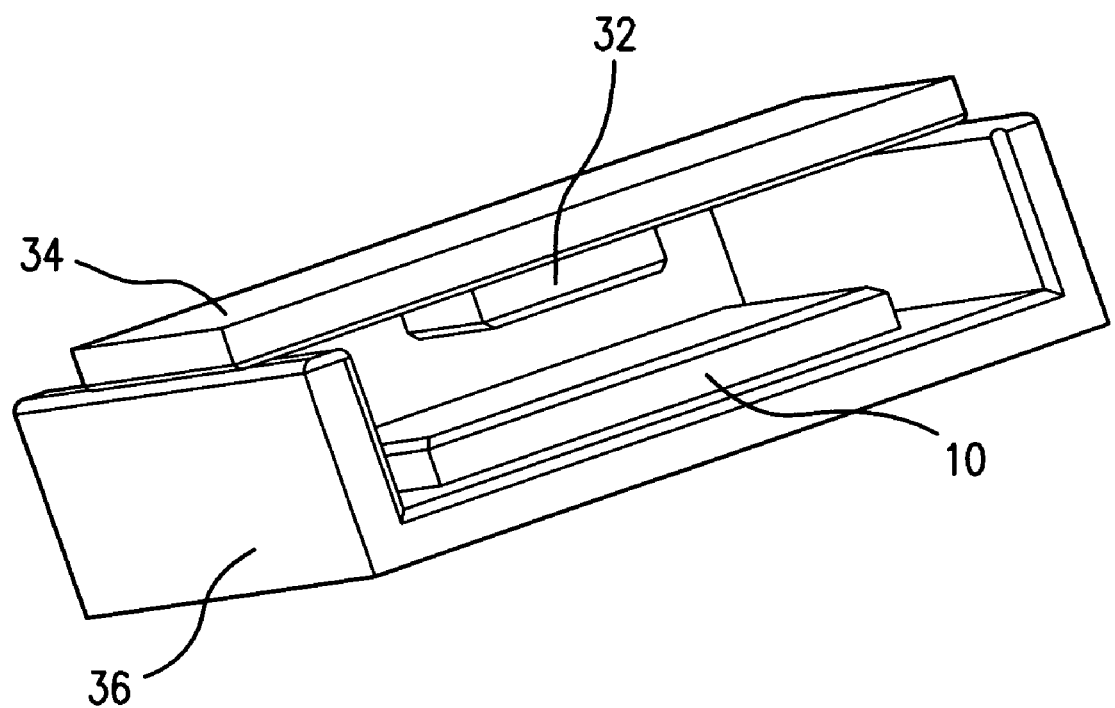
FIG. 12 is a perspective view of an exemplified MR device 10 that detects the presence of the magnetic material 32 embedded on a flexible substrate 34 that is suspended above the MR device.
Figure 13:
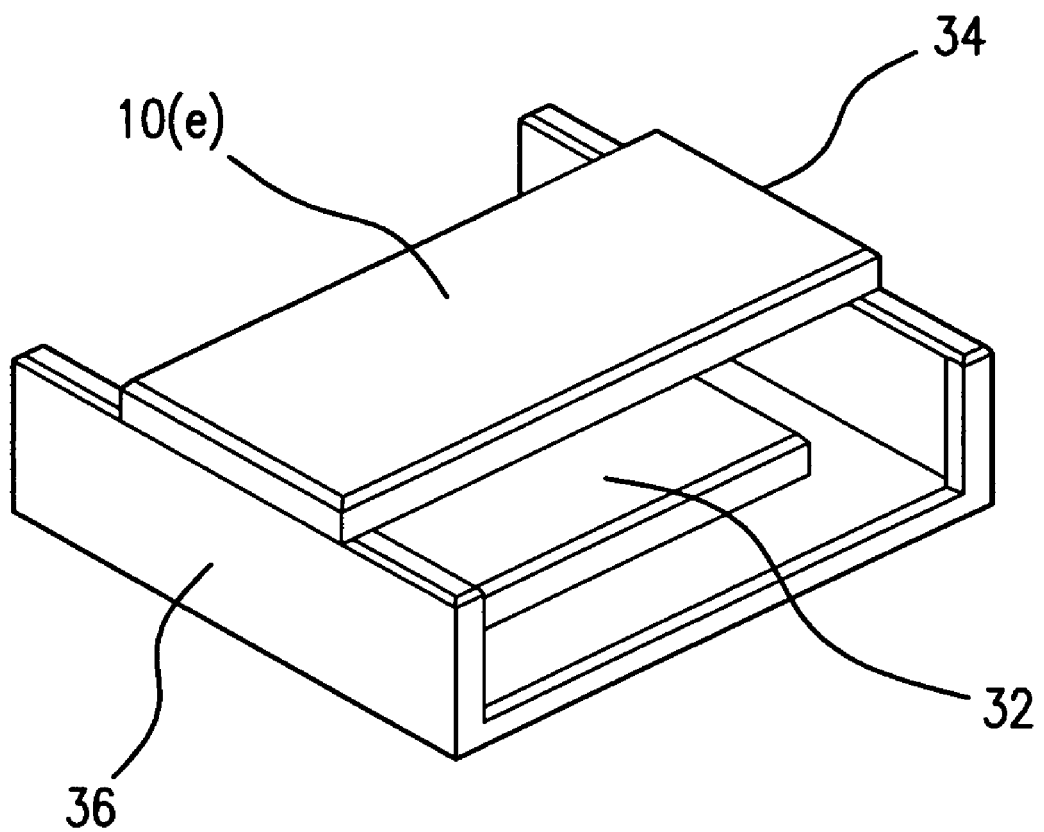
FIG. 13 is a perspective view of an exemplified MR device 10(e) integrated in to a flexible substrate. The MR device 10(e) detects the presence of the magnetic material 32 embedded on a fixture 36.

With specific reference to FIGS. 11 through 13, three non-limiting and exemplary embodiments of a magnetic field source in operation are depicted. First, FIG. 11 illustrates an embodiment wherein a stylus 30, containing a magnetized tip portion 32 is provided. The magnetized tip portion of the stylus can be selectively position proximal to the magneto resistive device 10 in order to effect a change in the resistance of the magneto resistive device. Alternatively, FIG. 12 illustrates an embodiment where a suitable magnetic material 32 is deposited on a flexible film 34. The flexible film is positioned proximal to the magneto resistive device 10 mounted on a Fixture 36. By depressing the flexible material in a direction toward the magneto resistive device 10, the magnetic field provided by the magnetic material 32 can influence and alter the resistance of the magneto resistive device 10. Turning to FIG. 13, an alternative arrangement similar to that of FIG. 12 is illustrated. However, in FIG. 13, the MR device 10(e) is deposited upon a flexible substrate or film 34 such that flexible substrate having the MR device can be depressed in a direction toward the magnetic field source 32 mounted on a fixture 36, thus influencing and altering the resistance of the magneto-resistive device.

Suitable means for detecting and/or measuring the change in the resistance (R) are common and widely known by those of ordinary skill in the art of resistance detection and measurement and can include, without limitation, detecting changes in voltage data or current data within a circuit containing a magneto-resistive element as described herein. More specifically, the principle of Ohm's Law states that electrical current (I) passing through a metal conductor having a resistance (R) in a circuit is directly proportional to the voltage (V) impressed across it, for any given temperature. Ohm's Law is therefore expressed in the form of the equation V=IR. Similarly, as one of ordinary skill in the art would appreciate, a generalized Ohm's law can also describe the relation between voltage and current in semi conducting materials and the MR devices.

Accordingly, following the principle of Ohm's Law, a first means for detecting or measuring the change in resistance of a magneto resistive element of the instant invention can comprise detecting changes in the current (I) for known applied voltage (V). For example, a current detection device or current sensor 22 as depicted in FIG. 3, can be integrated with and in operative communication with a circuit 20 containing an MR device 10 according to the instant invention. The current sensor 22 is integrated into the completed circuit in series with the voltage source (V) and the MR device 10. In one aspect, the current sensor functions to measure the current without otherwise electrically influencing the circuit 20. Under Ohm's law, the measured current will be inversely proportional to the resistance of the MR device for a known applied voltage V. Therefore, any detected change in the current I can be used to in turn detect change in the resistance R of the magneto resistive device. To that end, any known commercially available current detection device can be used, including for example an Oriel Instruments current preamplifier model 70710, or a more customized transimpedance amplifier using a Texas Instruments uA741 operational amplifier.

Figure 6:
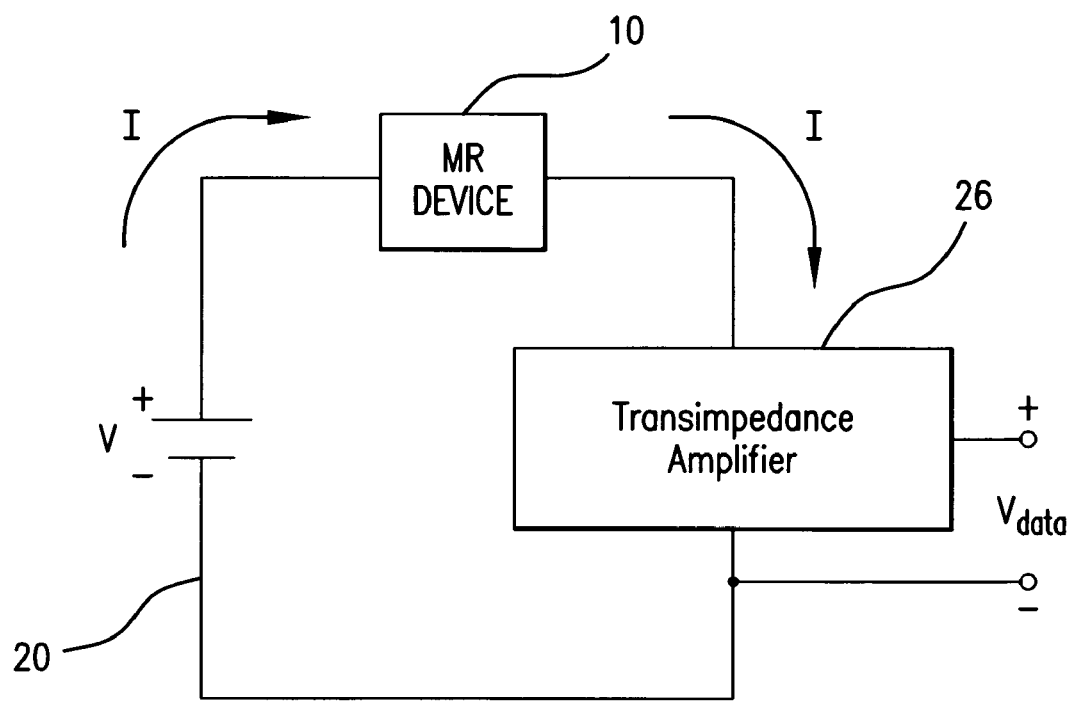
FIG. 6 is a schematic illustration of a circuit 20 having a voltage source V in operative communication with an MR device 10 in the complete circuit 20. The change in electrical resistance due to the presence of a magnetic field is detected by measuring the Vdata voltage signal provided by the current to voltage trans-impedance amplifier 26.
Figure 7:
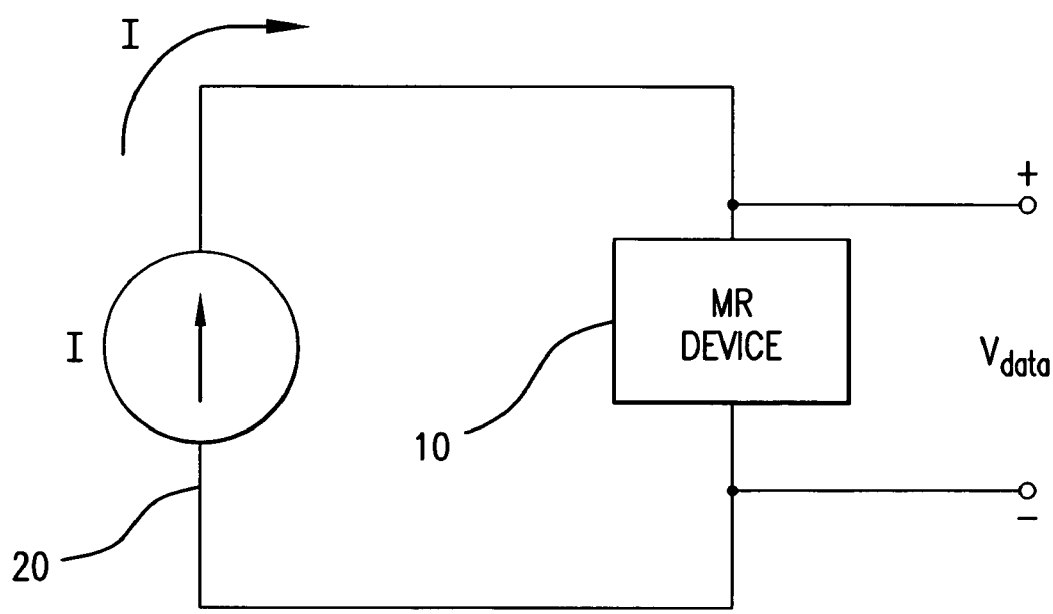
FIG. 7 is a schematic illustration of a circuit 20 having a current source I in operative communication with an MR device 10. The change in electrical resistance due to the presence of a magnetic field is detected through the voltage drop Vdata provided across the MR device 10.

Additionally, a trans-impedance amplifier also known as a current to voltage converter, can be used as a means to detect changes in current within a circuit. For example and as illustrated in FIG. 6, a trans-impedance amplifier 26 can be placed in series with an MR device 10. For a given current I, the trans-impedance amplifier will provide a measurable voltage output or Voltage data. As the current (I) fluctuates relative to a changing resistance of the MR device, the voltage data will also fluctuate, thus enabling one to detect and quantify the change in resistance of the magneto resistive element. Further, it will be appreciated that a trans-impedance amplifier provides a relatively large voltage out when compared to the level of current that is input into the device. Therefore, the use of a trans-impedance amplifier can have the added benefit of providing a reliable method of magneto resistance detection in circuits having relatively low levels of current.

Figure 4:
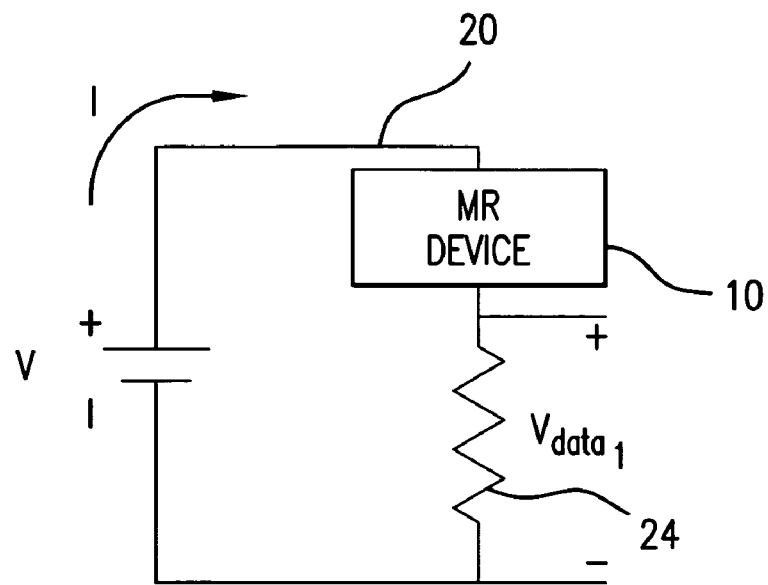
FIG. 4 is a schematic illustration of a circuit 20 having a voltage source V in operative communication with an MR device 10. The change in electrical resistance due to the presence of a magnetic field is detected through a change in voltage $Vdata_1$ across a resistive device 24.
Figure 5:
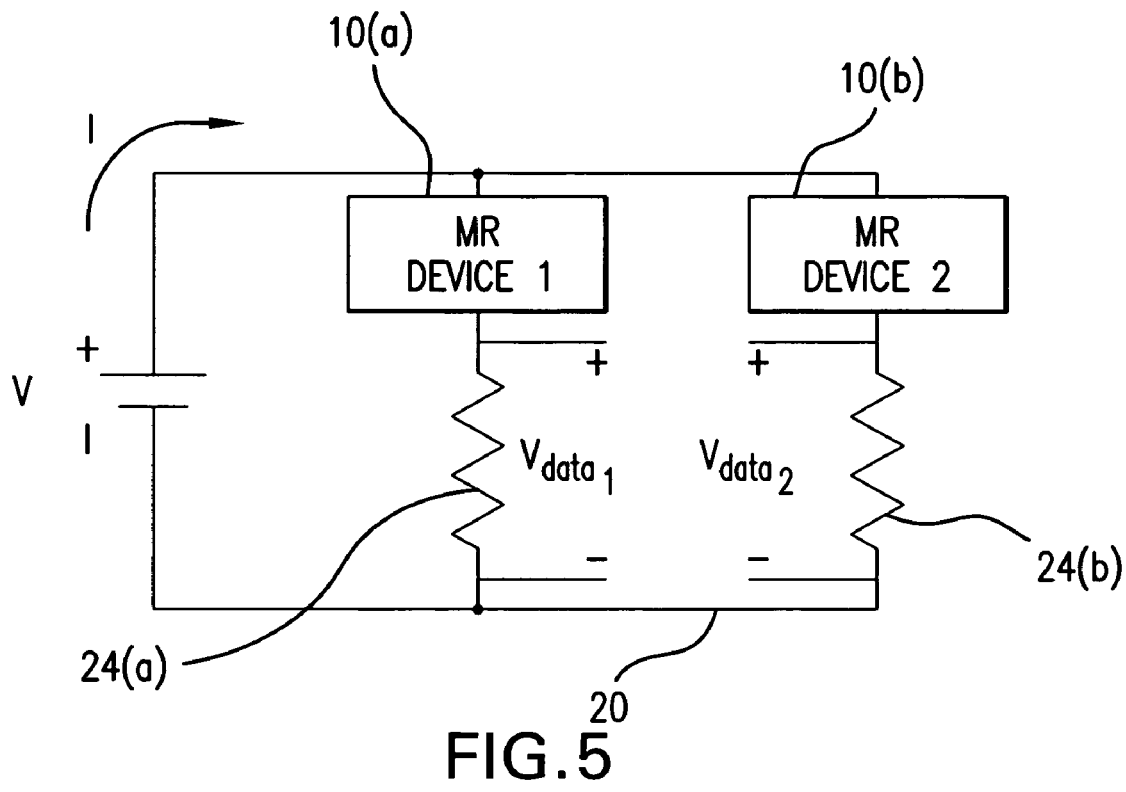
FIG. 5 is a schematic illustration of a circuit 20 having a voltage source V in operative communication with two MR devices 10(a) and 10(b). MR device 10(a) displays an increase in resistance due to the presence of a magnetic field, whereas MR device 10(b) shows a decrease in resistance due to the presence of the same magnetic field. The voltage $Vdata_1$ across resistive device 24(a) and the voltage $Vdata_2$ across resistive device 24(b) are differential, and therefore provides for differential voltage amplification methods.

Alternatively, and with reference to the circuit depicted in FIGS. 4 and 5, a voltage drop can be measured across a resistive device positioned in series with the MR. device. Both devices are in operative communication with the voltage source In an alternative embodiment, the principle of Ohm's Law enables a change in resistance to be detected and or measured by evaluating fluctuations in voltage data for a given current (I) within the circuit. For example, a voltmeter can be used to detect a voltage drop across the MR device 10. which is in operative communication with the current source.

Figure 8:
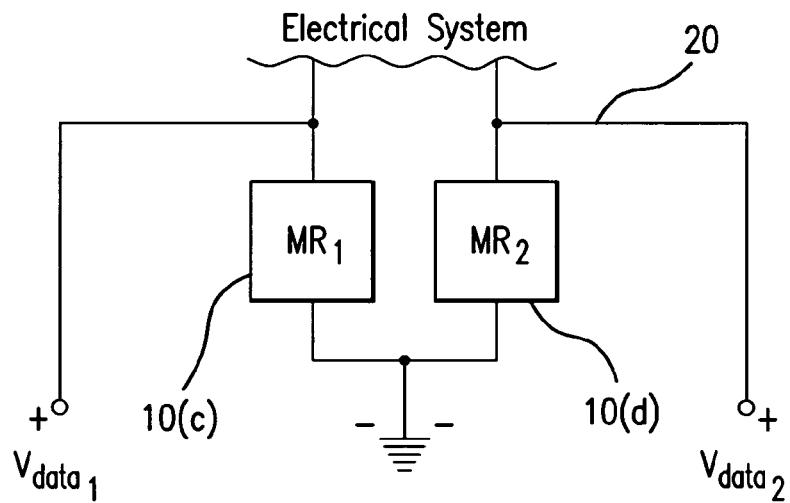
FIG. 8 is a schematic illustration of two MR devices 10(c) and 10(d) within an electrical system. MR Sensor 10(c) increases in resistance with an applied magnetic field. Sensor 10(d) decreases in resistance with an applied magnetic field. The differential voltage signals $Vdata_1$ and $Vdata_2$ provided across the sensor devices are used for differential voltage detection.
Figure 9:
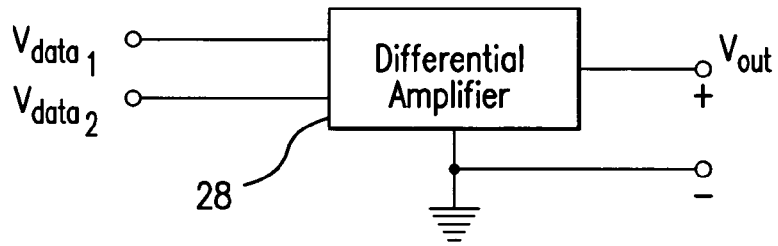
FIG. 9 is a schematic illustration of a differential amplifier 28 in communication with differential voltage signals $Vdata_1$ and $Vdata_2$ provided by the system of FIG. 5 or FIG. 8. The amplification results in a unified single voltage output Vout. This method of amplification removes common mode voltages.
Figure 10:
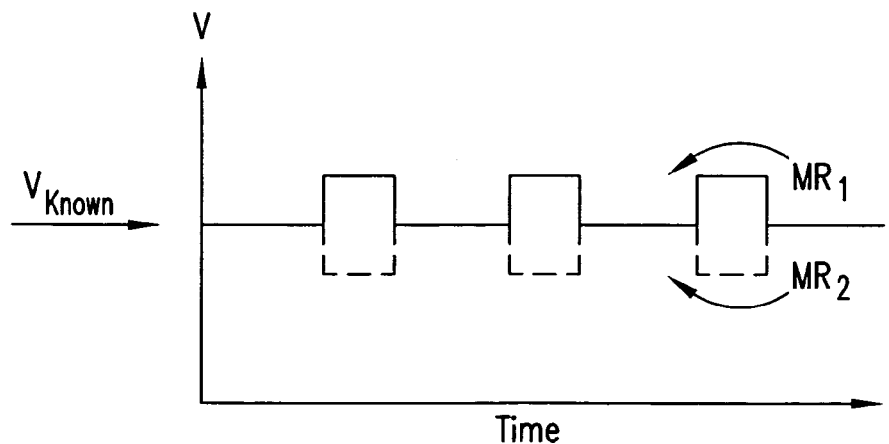
FIG. 10 is a plot diagram of $Vdata_1$ and $Vdata_2$ provided by the system of FIG. 5 or FIG. 8 over time. The differential pulses simultaneously provided by $MR_1$ and $MR_2$ result from the application of a magnetic field, and are superimposed on the DC bias voltage Vknown.

In still another embodiment, detection and quantification of differential voltage signals can be used to amplify the total voltage data and enhance the detection of relatively small changes in resistance of the Magneto Resistive element. More specifically, FIG. 8 illustrates an exemplary circuit 20 comprising at least two magneto resistive elements 10(c) and 10(d). MR device 10(c) is constructed and arranged to provide an increase in resistance when influenced by an external magnetic field. In contrast, MR device 10(d) is constructed to provide a decrease in resistance when influenced by the same magnetic field. FIG. 10 therefore illustrates a prophetic plot of voltage verses time for the differential voltage circuit of FIG. 8. As illustrated, the coincident positive MR effect of device 10(c) and negative MR effect of device 10(d) effectively amplifies the resulting voltage data and can again provide a reliable detection method for circuitry that may utilize relatively low voltages and or currents. Moreover, as indicated in FIG. 9, the differential voltage signals $Vdata_1$ and $Vdata_2$ can be further amplified by passing the signals through a differential voltage amplifier if desired.

In an alternative aspect, the present invention provides a system and method for detecting a magnetic field. The system comprises a magneto resistive element as described herein and having a predetermined resistance (R) that changes as a function of an external magnetic field. A voltage source is positioned in operative communication with the magneto-resistive device and provides a predetermined voltage (V) and a predetermined current (I) across the magneto resistive device. A means for detecting the change in the resistance of the magneto resistive element from the predetermined resistance (R) is also provided. In use, a detection system for monitoring and detecting changes in the resistance of the MR device will indicate and enable the detection of an unknown external magnetic field.

In one aspect, it is contemplated by the instant invention that the system and method for detecting a magnetic field as set forth above can find specific application in use as a magnetic read head for reading data stored on magnetic media such as a recorded tape or diskette. The magnetization of the magnetic media can provide the source of the magnetic field that can influence the MR device or devices of the instant invention to effect a change in the resistance in one or more of the MR devices. These changes in resistance can thus be detected and quantified as described herein. Further, the data obtained through detection of the change in resistance can then be evaluated and converted to reflect the data that was magnetically stored on the magnetized media.

In still another aspect, the present invention provides a method for detecting magneto resistance, comprising providing a magneto resistive element having a first electrode, a second electrode, and a semi conductive organic layer disposed between the first and second electrodes. The magneto resistive element having a predetermined resistance (R). A predetermined voltage (V) and a predetermined current (I) are applied across the semi conductive organic layer of the magneto resistive element and are supplied by a voltage source in operative communication with the first and second electrode of the magneto resistive device. An external magnetic field having a predetermined strength is selectively positioned proximal to the semi conductive organic layer of the magneto resistive element such that the resistance of the magneto resistive element is changed from the predetermined resistance (R). The change in the resistance of the magneto resistive element from the predetermined resistance (R) is then detected by any suitable means for detecting a change in the resistance of the magneto resistive device.

In still another aspect, the present invention further provides for the use of the magneto resistive elements described herein in a display device. The display device will therefore comprise a substrate and a plurality of magneto resistive elements as described herein disposed onto the substrate. A voltage source is positioned in operative communication with at least one of the plurality of magneto resistive elements, the voltage source providing a predetermined voltage (V) and a predetermined current (I) across the semi conductive organic layer of the at least one of the plurality of the magneto resistive elements. The display device further comprises a means for detecting a change in the resistance of the at least one of the plurality of magneto resistive elements from the predetermined resistance (R).

As mentioned herein, the magneto resistive devices of the instant invention can in one aspect be comprised of the same or similar material as traditional or conventional organic light emitting diode devices. Therefore, in on aspect, an MR device of the instant invention can function as both an OLED display element as well as a magneto resistive element. Accordingly, a display device can comprise a plurality of MR devices which also function as an plurality of pixels. Each combined MR device/display pixel can be driven by its own voltage source circuitry or a group of MR device/display pixels can be assign to a particular voltage source circuit. Similarly, each MR device/display pixel can have its own detection circuitry for detecting changes in magneto resistance. Alternatively, a group of MR devices/display pixels can be assigned to a particular or single detection circuitry.

In one aspect, a display device described herein will comprise a predetermined matrix of pixels. The matrix can be at least a two dimensional matrix. In an alternative aspect, it is contemplated that the matrix can even be a three dimensional matrix of pixels. As described above, the MR devices of the instant invention can also function as the pixels themselves or can be positioned in proximity to and in registration with the pixels. To that end, in one aspect, a single MR device can be positioned in registration with a single pixel. Alternatively, a single MR device can be positioned in registration with a plurality of pixels. Further, in still another aspect, a plurality of MR devices can be positioned in registration with a single display pixel.

Figure 23:
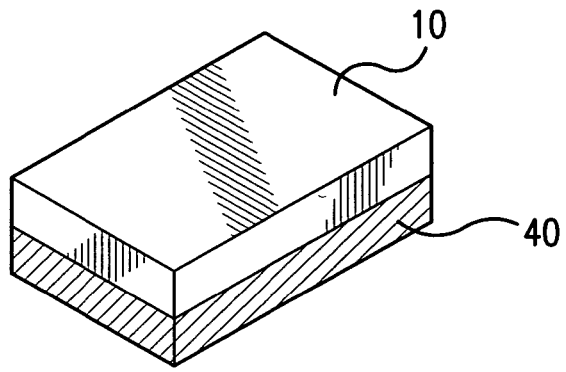
FIG. 23 is a partial perspective view of an exemplified MR device 10 in registration with a single display pixel 40 of a display.
Figure 24:
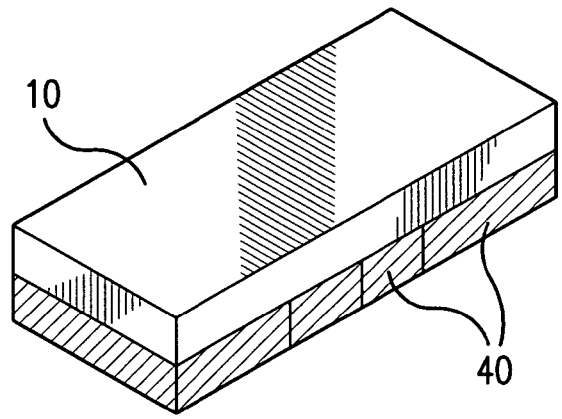
FIG. 24 is a partial perspective view of an exemplified MR device 10 in registration with a plurality of display pixels 40 of a display.
Figure 25:
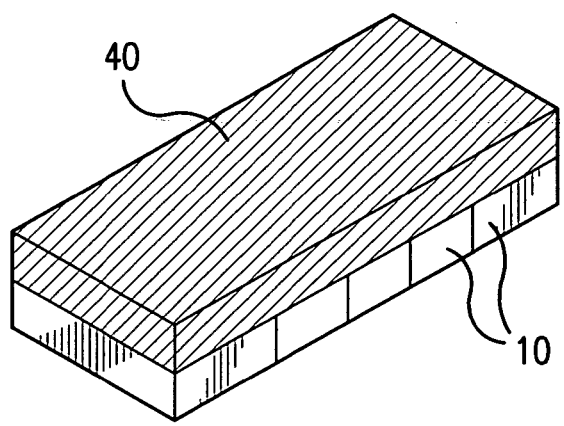
FIG. 25 is a partial perspective view of an exemplified plurality of MR devices 10 in registration with a single display pixel 40 of a display.
Figure 26:
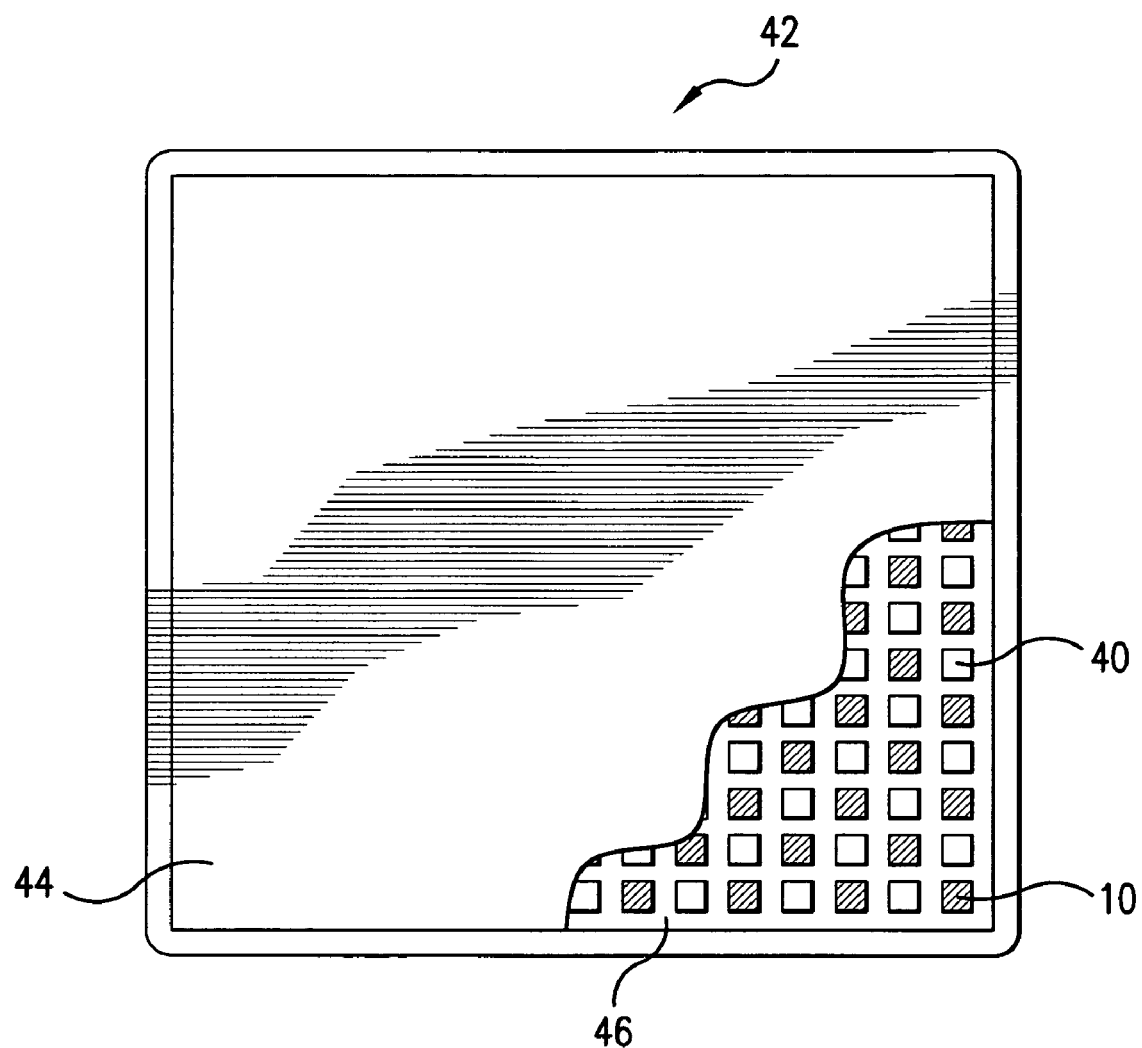
FIG. 26 is a top elevational view of a display with a portion broken off to show a plurality of underlying MR devices arrayed on a substrate.

With specific reference to FIGS. 23-26, several exemplary aspects of the MR device of the instant invention positioned in registration with one or more pixels of a display device are illustrated. For example, FIG. 23 illustrates a single MR device 10 in registration with a single pixel 40. It should be understood that the MR device 10 can be positioned adjacent to the pixel or can alternatively underlie or overlie the pixel. FIG. 24 similarly illustrates a single MR device 10 positioned in registration with a plurality of display pixels 40. Again, the MR device 10 can be positioned adjacent to the plurality of pixels or can alternatively underlie or overlie the plurality of pixels. FIG. 25 illustrates a plurality of MR devices 10 in registration with a single display pixel 40. Once again, the plurality of MR devices 10 can be positioned adjacent to the pixel or can alternatively underlie or overlie the pixel. For example, FIG. 26 illustrates a display device 42 having a plurality of MR devices 10 mounted on a substrate 46 and positioned in underlying registration with a display screen 44. In this example, each MR device is in registration with a plurality of the pixels 40 that form the display screen.

It is contemplated that in one aspect, a display device comprising a plurality of MR devices as described herein will find application in use as a touch screen. Accordingly, one or more MR devices can be integrated into a touch screen whereby a magnetic material influences the MR device embedded within the screen to thereby effect a change in resistance of the MR device or devices and subsequently trigger an electronic response either in the display properties or other electrical system in operative communication therewith. For example, and with reference to FIG. 11-13, several aspects are again depicted wherein a magnetic material is selectively applied to an MR device 10. Specifically, as depicted therein, the touch screen can be activated by the use of a magnetic stylus or alternatively by a magnetic button arrangement wherein the magnetic material is applied to an MR device by depressing a flexible fixture toward a fixed fixture. The flexible fixture can comprise the magnetic material such that it is depresses toward the MR device deposited on a fixed fixture. Alternatively, the flexible fixture can comprise the MR device such that the MR device is depressed in direction toward a magnetic material deposited on a fixed substrate.

In still another aspect, it is contemplated by the instant invention that an MR device or array of a plurality or MR devices as described herein can be used for applications relating to magnetic data storage. To that end, as discussed above, an MR device comprised of one or more magnetic electrode materials can retain or store magnetic memory once an applied magnetic field is removed. Therefore, in an application similar to a single bit magnetic-random access memory (MRAM) device, a current carrying wire can be used for writing to the MRAM bit. Since any current carrying wire is surrounded by a magnetic field, then this magnetic field will magnetize the magnetic electrode or electrodes of the MR device. The magnetic electrode will thus memorize the written magnetic field, since the magnetic contact will provide a magnetic field across the MR device even after the applied magnetic field caused by the current carrying wire has been turned off. The resistance change in the MR device can then be used for reading out the bit that was previously written. An array of such MR devices as described above can thus be used as a single bit MRAM device or can be used as a multi-bit MRAM chip, where a grid of wires is used for writing the individual bits.

EXPERIMENTAL

The following examples and experimental data are put forth so as to provide those of ordinary skill in the art with a complete disclosure and description of how the magneto resistive elements, systems comprised thereof or methods for manufacture and use thereof can be made, used and/or evaluated. These examples are intended to be purely exemplary of the invention and are not intended to limit the scope of what is encompassed within the spirit and scope of the invention. Efforts have been made to ensure accuracy with respect to numbers (e.g., amounts, temperature, etc.) However, some minor errors and deviations should be accounted for. Unless indicated otherwise, parts are parts by weight, temperature is in ° C. or is at ambient temperature, and pressure is at or near atmospheric.

With reference to FIGS. 14 through 17, several experimental magneto resistive devices according the instant invention were manufactured and tested using the polymer poly(9,9-dioctylfluorenyl-2,7-diyl), referred to herein as PFO as the organic semiconductor sandwiched between a top and bottom electrode. The PFO polymer was obtained from American Dye Source, Inc. (Baie D'Urfe, Quebec, Canada) The bottom electrode consisted of either indium-tin-oxide (ITO) covered glass or Gold evaporated onto a glass slide or PEDOT spin-coated onto ITO covered glass. The polymeric film was fabricated by spin-coating from a toluene solution at 2000 RPM followed by baking at approximately 90 degrees C. over night. To achieve varying film thickness, different concentrations of the polymer toluene or chloroform solution were used, ranging from approximately 7 to 30 mg of PFO per ml of toluene or chloroform.

The top electrode consisted of either Aluminum, Calcium covered with a cap layer of Aluminum or Gold, which were evaporated through a shadow mask having an active area of approximately 1 $mm^2$ at a base pressure of approximately $10^{-6}$ mbar. All of the above-mentioned manufacturing steps were performed inside a nitrogen glove-box. The magneto resistance measurements were performed with the sample mounted on the cold finger of a closed-cycle He cryostat located between the poles of an electromagnet. The magneto resistance was then determined by measuring the current at a constant voltage.

Figure 21:
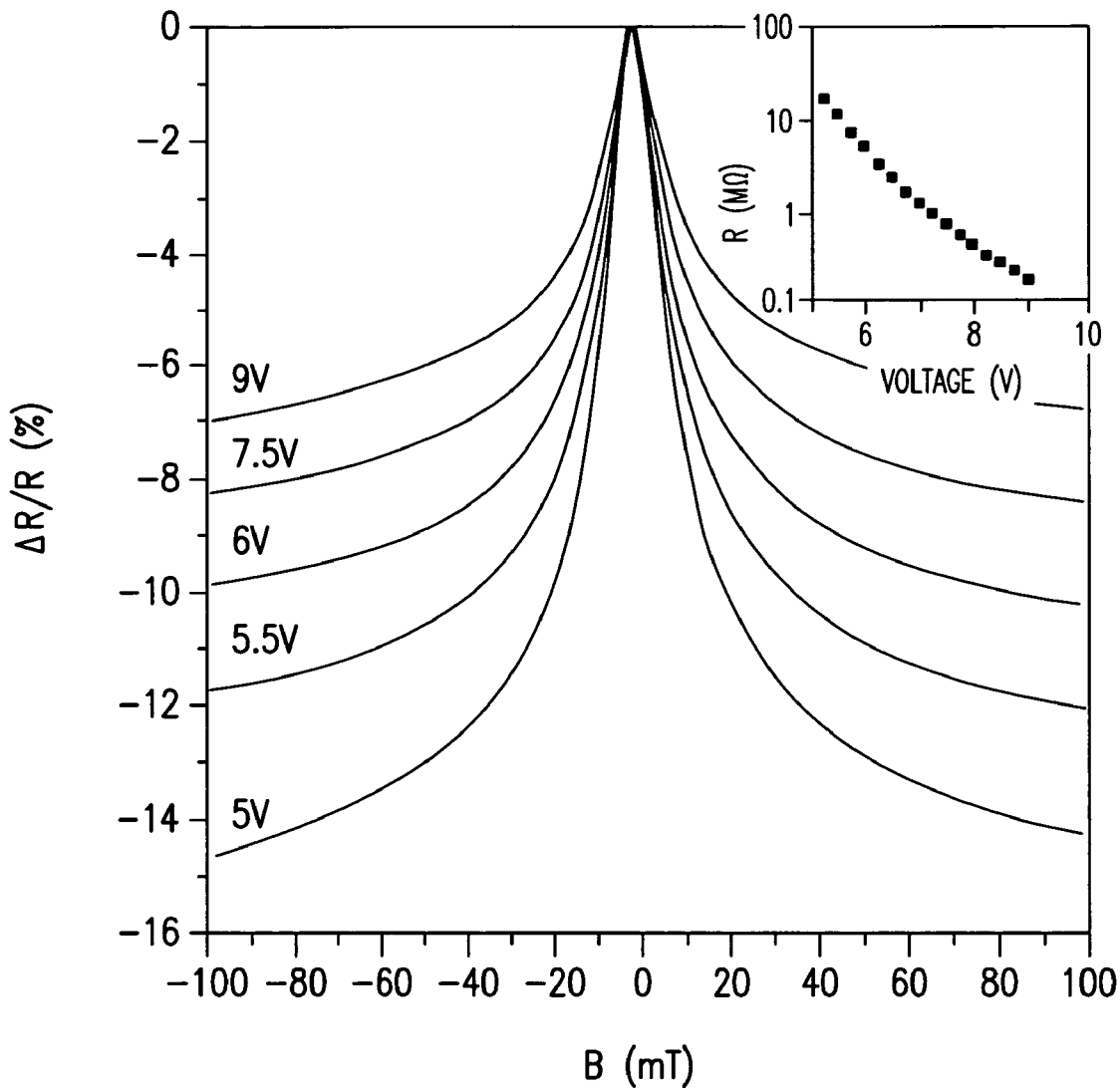
FIG. 21 is a plot illustrating the magneto resistance response, ΔR/R curves, in an ITO/PEDOT/PFO (100 nm)/Ca device at different applied voltages. The inset graph shows the trend in device resistance as a function of the applied voltage.

FIG. 21 is a plot of the magneto resistance curves, measured as a percentage $\Delta R/R \equiv (R(B)-R(0))/R(0)$, as a function of magnetic field, B, measured at room temperature for a magneto resistive device comprised of a PEDOT covered ITO first electrode, a PFO thin film approximately 100 nm in thickness and a Calcium top electrode. The inset graph shows the device resistance as a function of the applied voltage.

Figure 14:
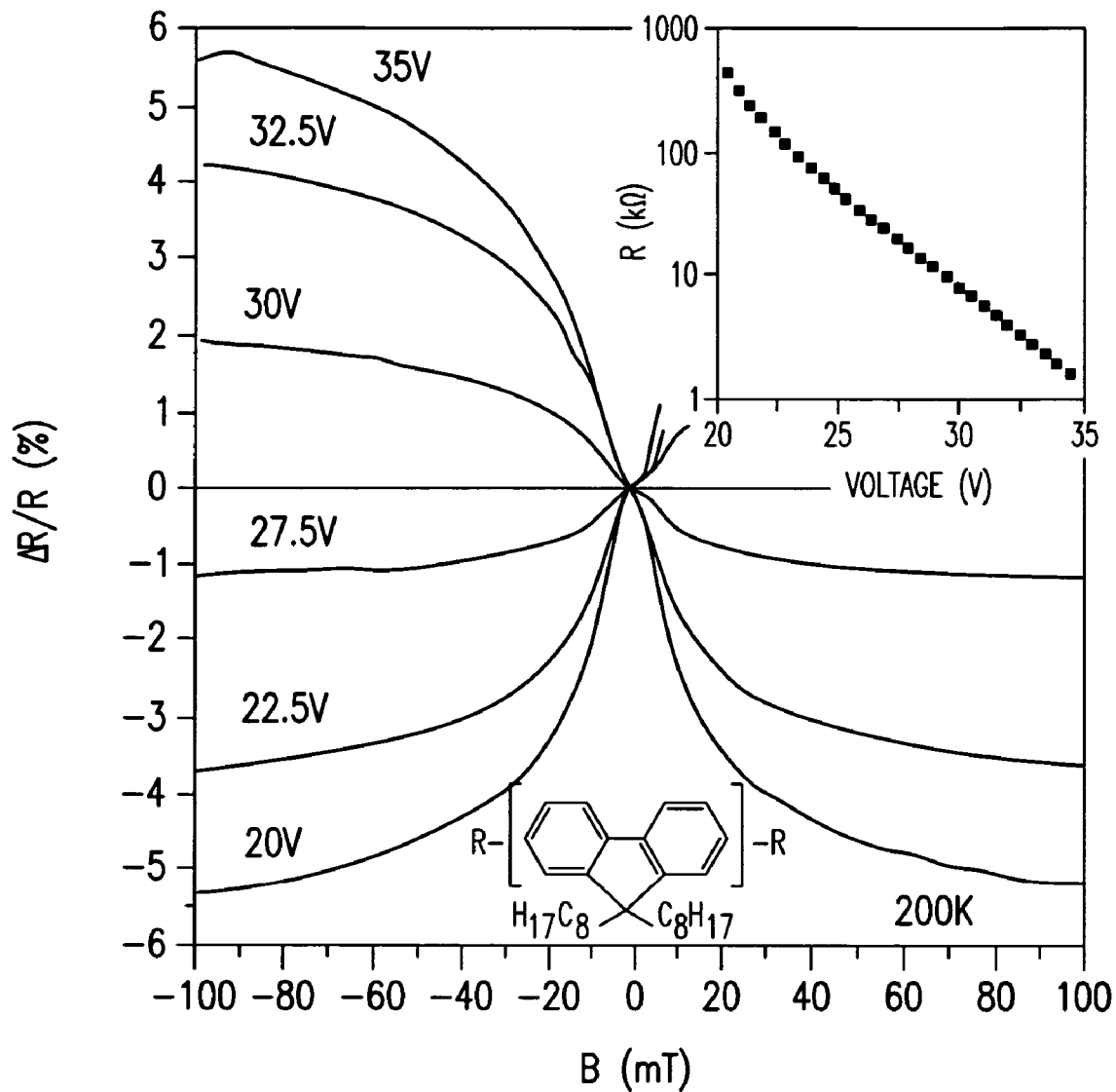
FIG. 14 is graph indicating the magneto resistance response, ΔR/R curves, in an ITO/PFO (60 nm)/Ca MR device measured at several different applied voltages. The inset graph shows the device resistance as a function of the applied voltage.

FIG. 14 is a plot of the magneto resistance curves, measured as a percentage $\Delta R/R$, measured at 200 K for a magnetoresistive device comprised of an ITO first electrode, a PFO thin film approximately 60 nm in thickness and a Calcium top electrode. The inset graph shows the device resistance as a function of the applied voltage. Further, it can be seen from FIG. 14 that both positive and negative magneto-resistance is observed, which in this example was dependent on the amount of voltage applied to the magneto resistive element.

Figure 16:
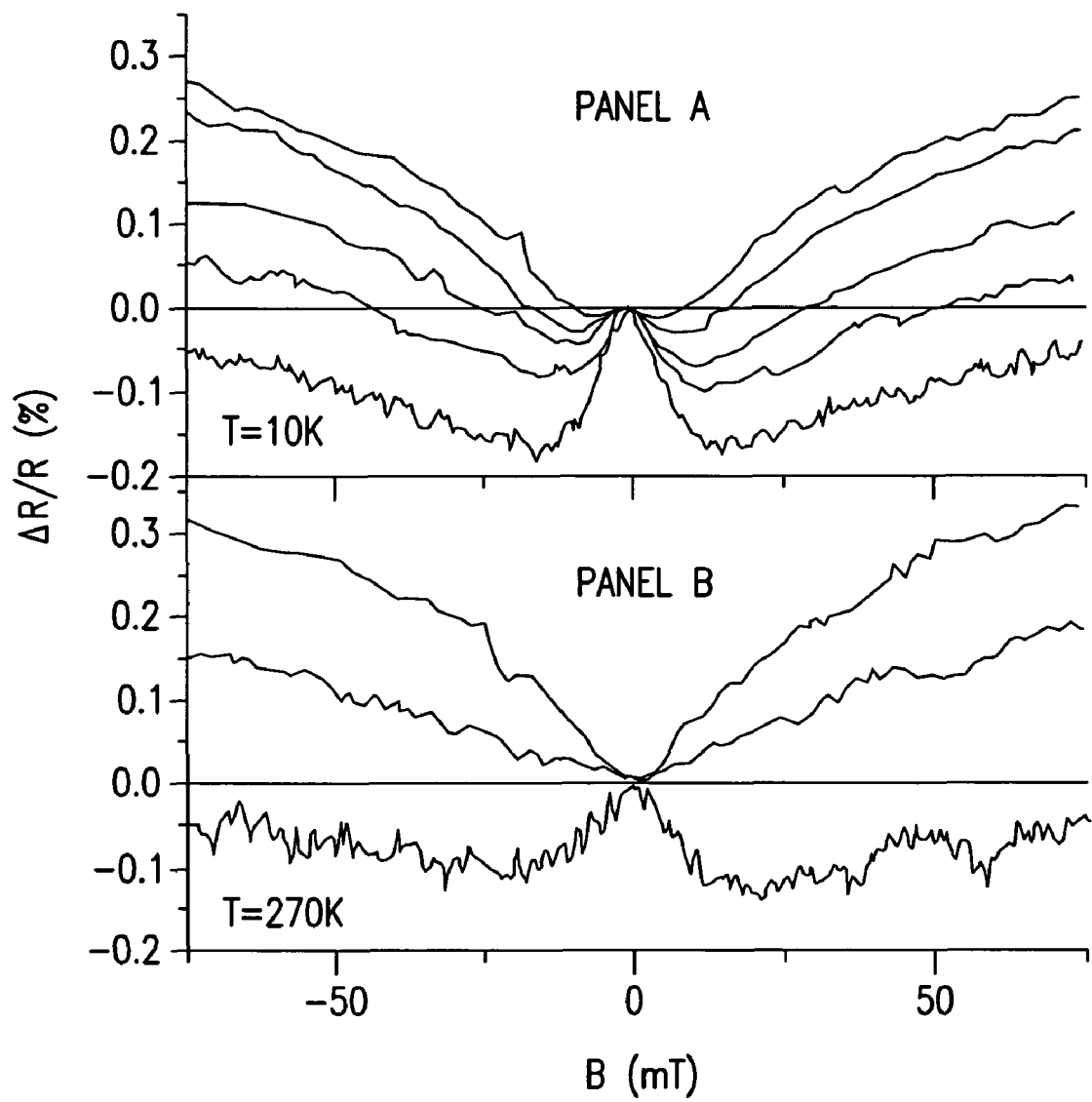
FIG. 16 is a plot illustrating the magneto resistance response, ΔR/R traces, at voltages close to or at the transition point between negative and positive MR response in a Au/PFO (≈150 nm)/Al device. Panel A indicates measurements at a temperature of approximately 10K and Panel B indicates measurements at a temperature of approximately 270K.

FIG. 16 illustrates the MR curves, measured as a percentage $\Delta R/R$, in a similar PFO magneto resistive device in the voltage region where the transition between a negative and positive MR effect occurs. The MR device comprised a Gold electrode and a PFO layer of approximately 150 nm in thickness and an Aluminum top electrode. The magneto resistance was measured at 10 K as indicated in panel A and measured again at 270 K as indicated in panel B. It can be seen that the transition from negative to positive MR occurs first at relatively large magnetic fields (B), and that the MR traces are non-monotonic functions of the applied magnetic field.

Figure 15:
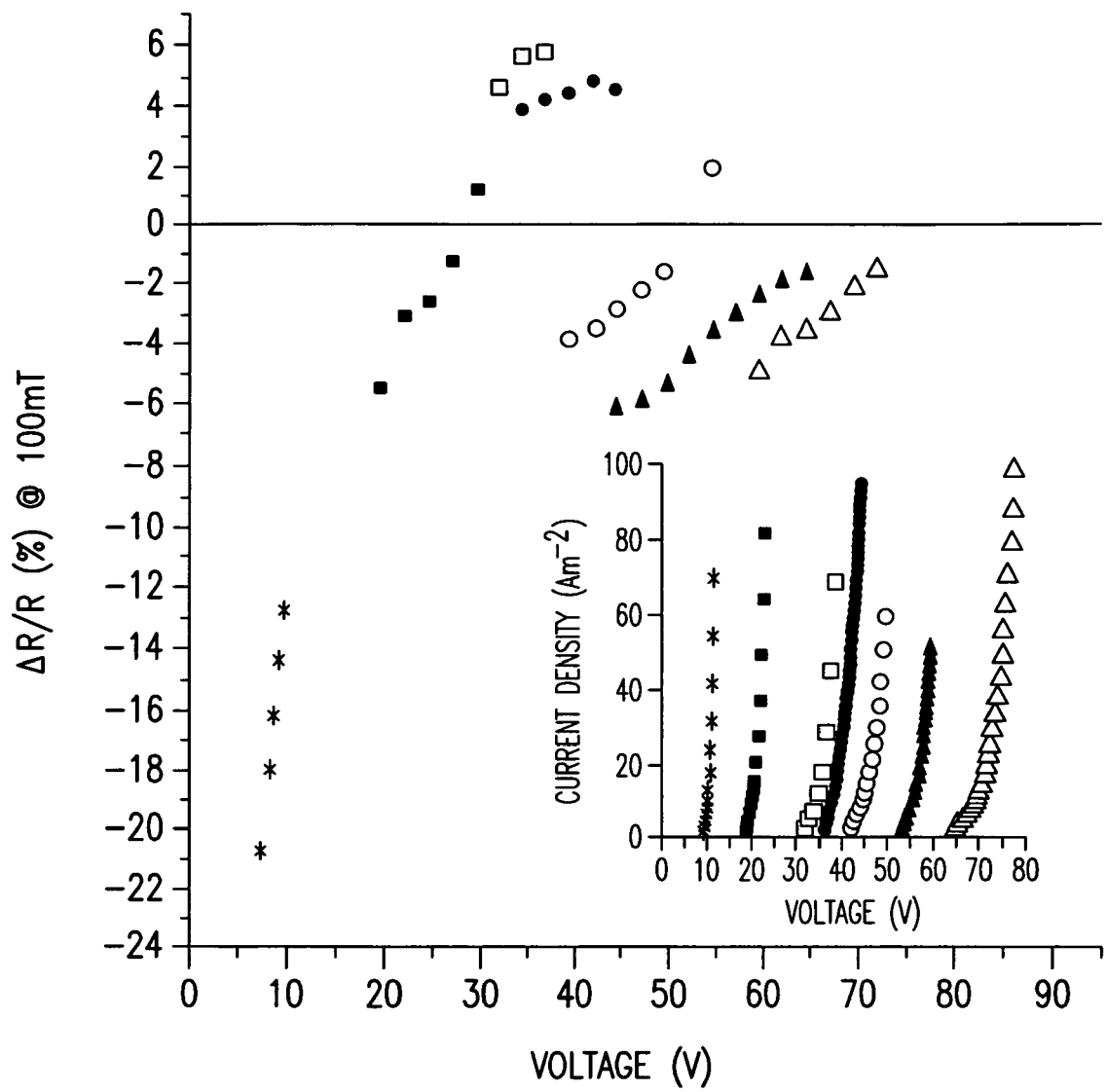
FIG. 15 is a graph indicating the dependence of the magnitude of the MR effect, ΔR/R at 100 mT and 200 K on the device voltage in a variety of devices manufactured with different polymer film thicknesses and electrode materials. The inset shows the current-voltage characteristics of these devices. ★ is for an ITO/PEDOT/PFO (100 nm)/Ca, ■ is for an ITO/PFO (60 nm)/Ca device, □ is for ITO/PFO (100 nm)/Al, ● is for ITO/PFO (100 nm)/Ca, ○ is for ITO/PFO (140 nm)/Ca, ▲ is for ITO/PFO (150 nm)/Au, △ is for Au/PFO (150 nm)/Ca, and ▼ is for ITO/PFO (300 nm)/Ca.

FIG. 15 illustrates the dependence of the magnitude of the MR effect, measured as a percentage $\Delta R/R$ at a magnetic field of 100 mT and at a temperature of approximately 200 K, on the device voltage in a variety of devices with different polymer film thicknesses and electrode materials. FIG. 15, inset shows the current-voltage characteristics of the measured devices. It can be seen that the IV curves are strongly non-linear. It is also evident from the inset graph to FIG. 15 that the linear-linear IV plot is determined mostly by the film thickness, and that IV and MR curves do not critically depend on the electrode materials used, especially the top electrode material. This tends to support the current understanding that the observed MR effect is due to hole transport theories and that it is possibly not related to electron transport or electron-hole recombination processes that can occur in conventional OLED devices.

Figure 17:
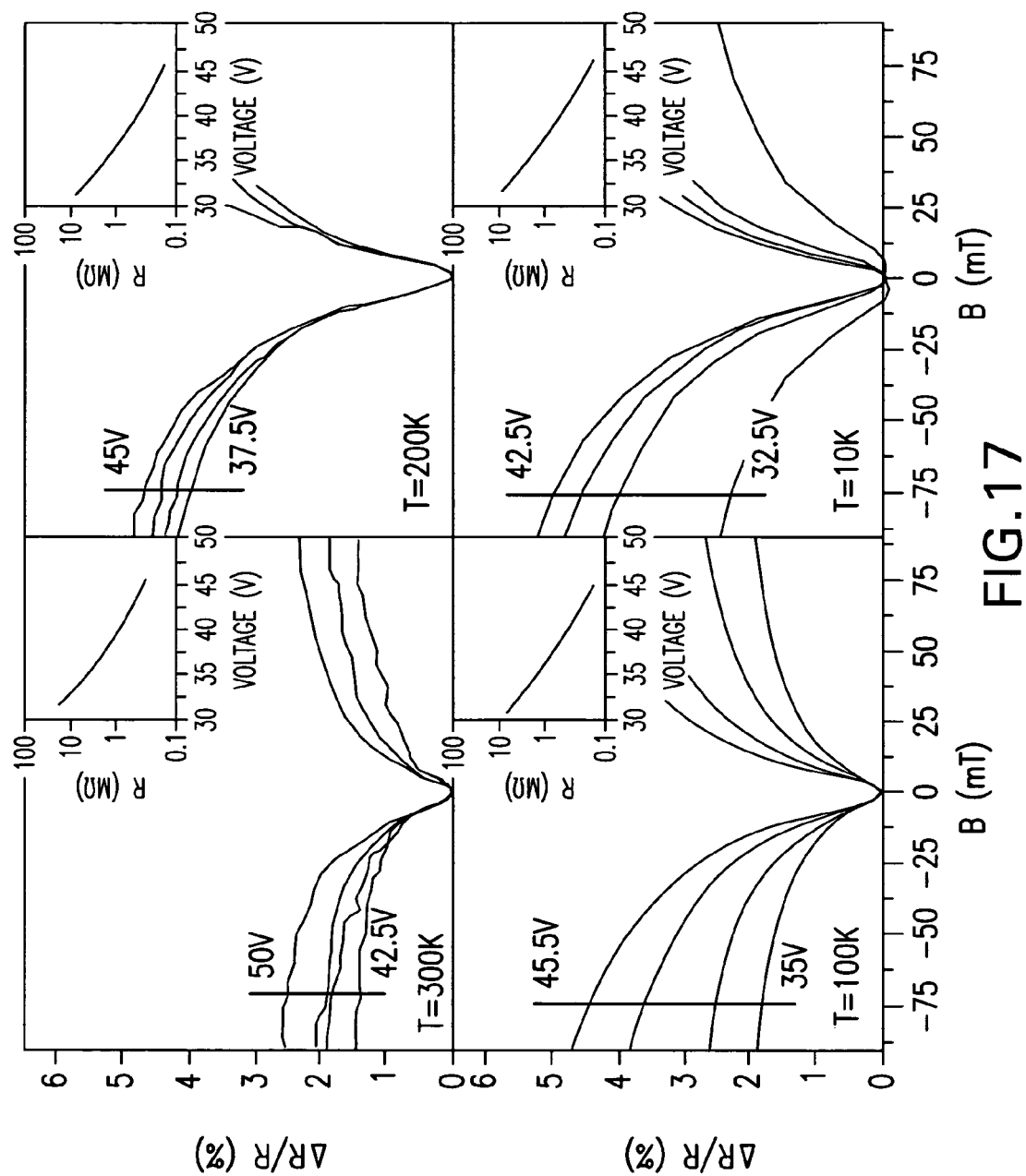
FIG. 17 is a plot illustrating the magneto resistance response, Δ R/R curves, of an ITO/PFO (150 nm)/Ca device measured at different temperatures, namely 10 K, 100 K, 200 K, and 300 K. The applied voltages are assigned. The inset graphs show the trend in device resistance as a function of the applied voltage.

FIG. 17 depicts the MR traces of a magneto resistive device (ITO/PFO (150 nm)/Ca) as a function of temperature. Similar trace results were obtained for the negative MR effect traces. It can be seen that the MR effect is observed at all temperatures spanning the range between 10K and 300K indicating that the magnitude and width of the MR effect is at least substantially insensitive to surrounding temperature profiles.

Figure 18:
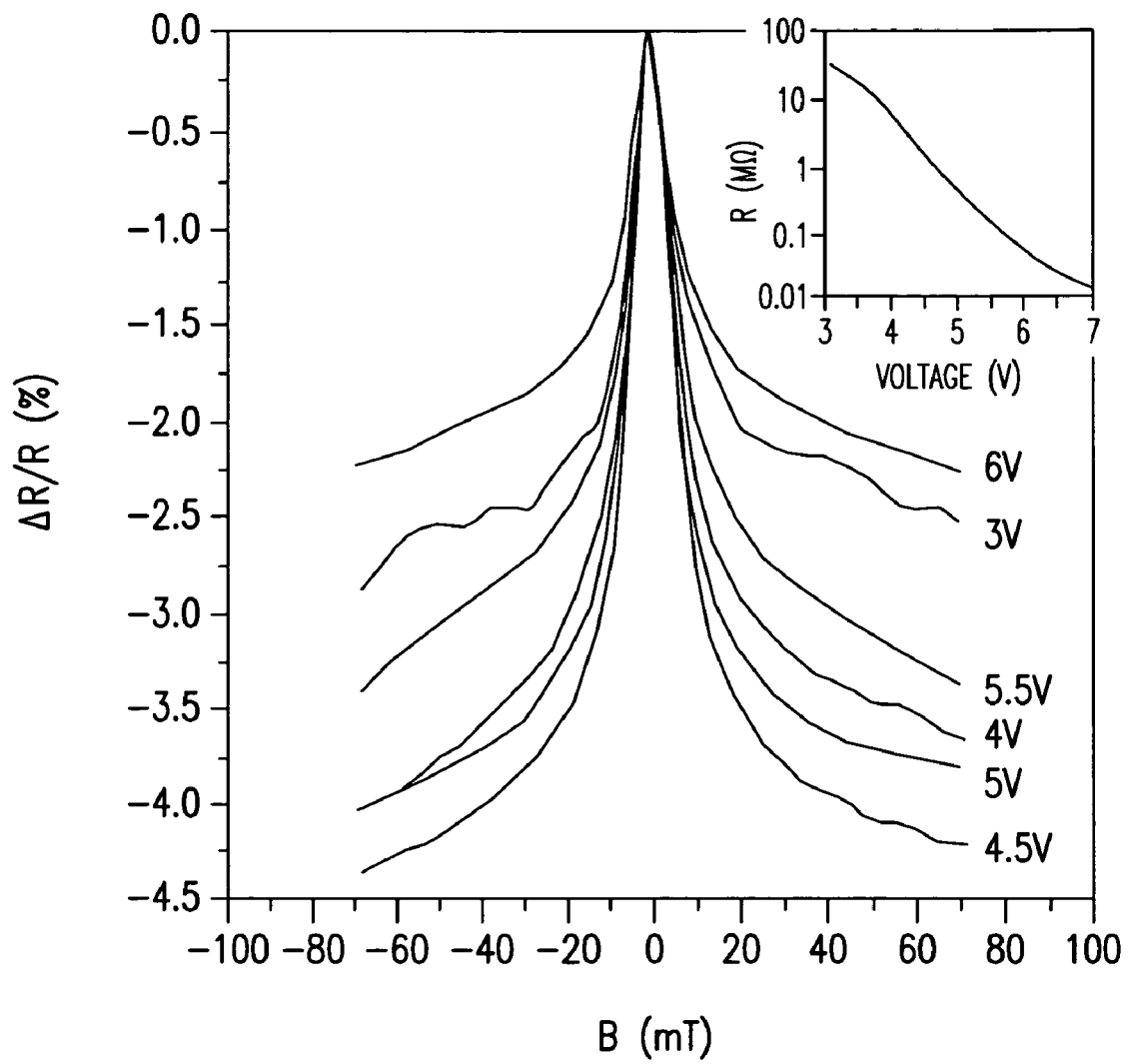
FIG. 18 is a plot illustrating the magneto resistance response, ΔR/R curves, in an ITO/PEDOT/RegioRandom poly(3-octyl-thiophene) (100 nm)/Ca device at different applied voltages. The inset graph shows the trend in device resistance as a function of the applied voltage.

FIG. 18 is a plot of the magneto resistance curves, measured as a percentage $\Delta R/R$, measured at room temperature for a magneto resistive device comprised of a PEDOT covered ITO first electrode, a regio-random poly-3-octyl-thiophene thin film (supplier Sigma-Aldrich corporation) approximately 100 nm in thickness and a Calcium top electrode. The inset graph shows the device resistance as a function of the applied voltage.

Figure 19:
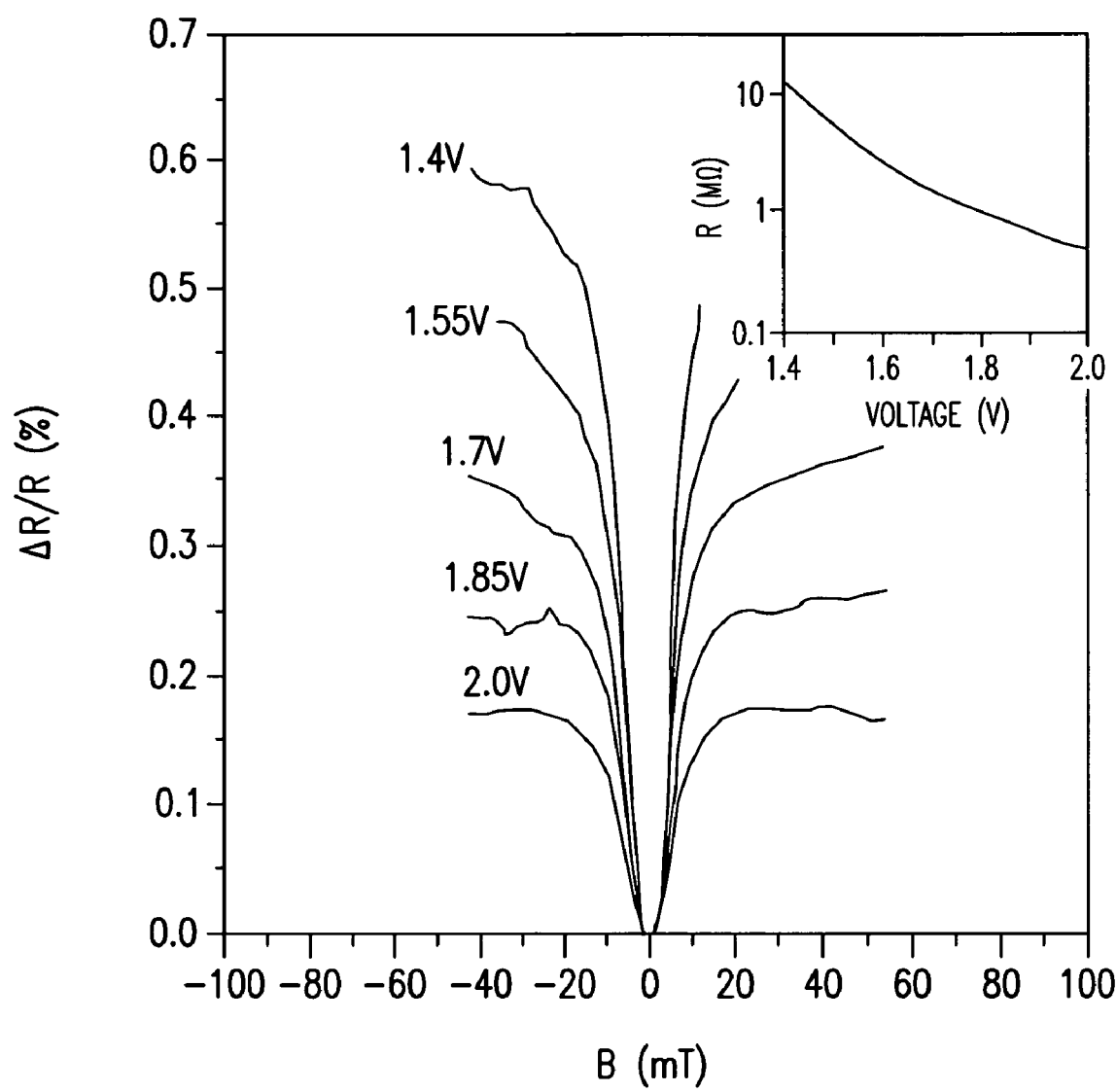
FIG. 19 is a plot illustrating the magneto resistance response, ΔR/R curves, in an ITO/PEDOT/RegioRegular poly(3-hexyl-thiophene) (100 nm)/Ca device at different applied voltages. The inset graph shows the trend in device resistance as a function of the applied voltage.

FIG. 19 is a plot of the magneto resistance curves, measured as a percentage $\Delta R/R$, measured at room temperature for a magneto resistive device comprised of a PEDOT covered ITO first electrode, a regio-regular poly-3-hexyl-thiophene thin film (supplier Sigma-Aldrich corporation) approximately 100 nm in thickness and a Calcium top electrode. The inset graph shows the device resistance as a function of the applied voltage. In contrast to results in regio-random poly-3-octyl-polythiophene, and in the most part PFO, regio-regular poly-3-hexyl-polythiophene shows a positive MR response at all voltages tested.

Figure 20:
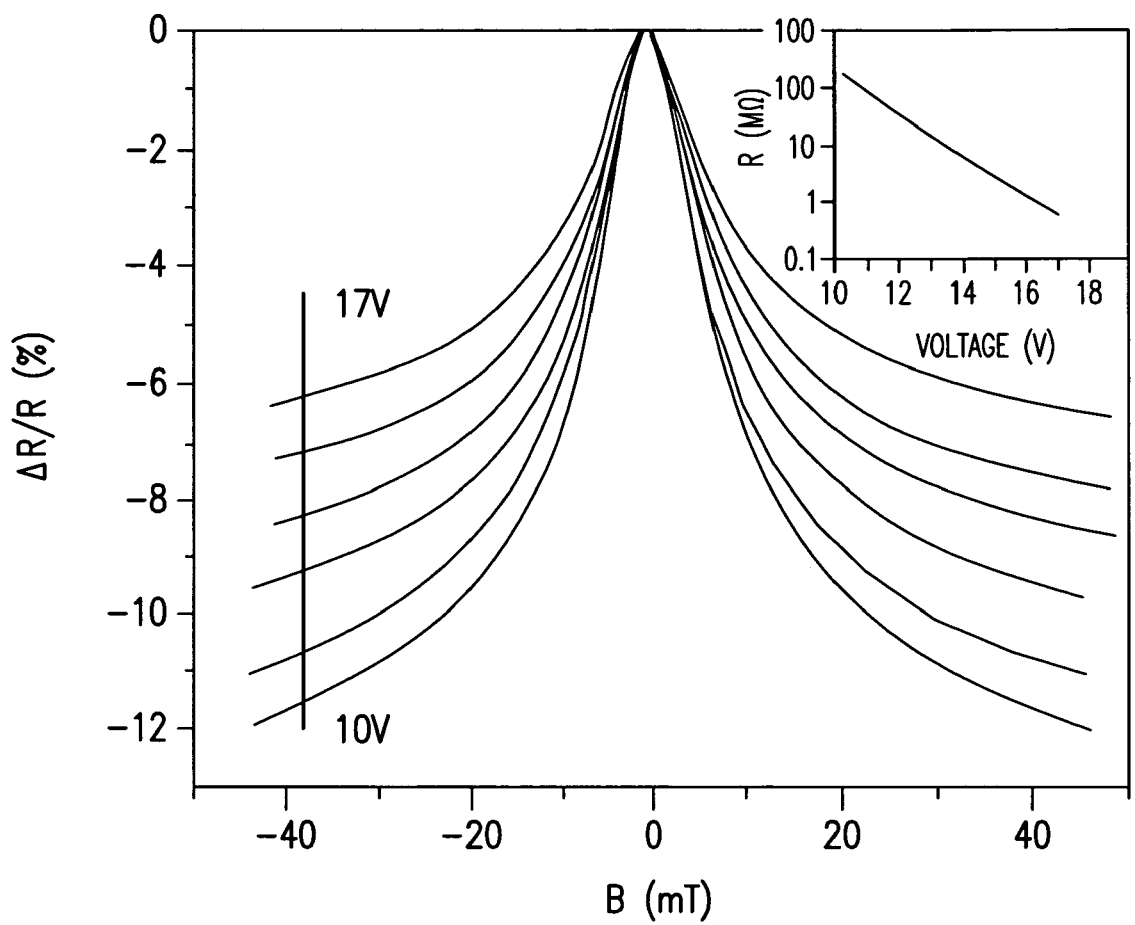
FIG. 20 is a plot illustrating the magneto resistance response, ΔR/R curves, in an ITO/PEDOT/RegioRandom poly(3-octyl-thiophene) (1%)-PFO mixture (100 nm)/Ca device at different applied voltages. The inset graph shows the trend in device resistance as a function of the applied voltage.

FIG. 20 is a plot of the magneto resistance curves, measured as a percentage $\Delta R/R$, measured at room temperature for a magneto resistive device comprised of a PEDOT covered ITO first electrode, a PFO/regio-random poly-3-octyl-thiophene mixture (1 weight percent of regio-random poly-3-octyl-thiophene) thin film (supplier Sigma-Aldrich corporation) approximately 100 nm in thickness and a Calcium top electrode. The inset graph shows the device resistance as a function of the applied voltage.

Figure 22:
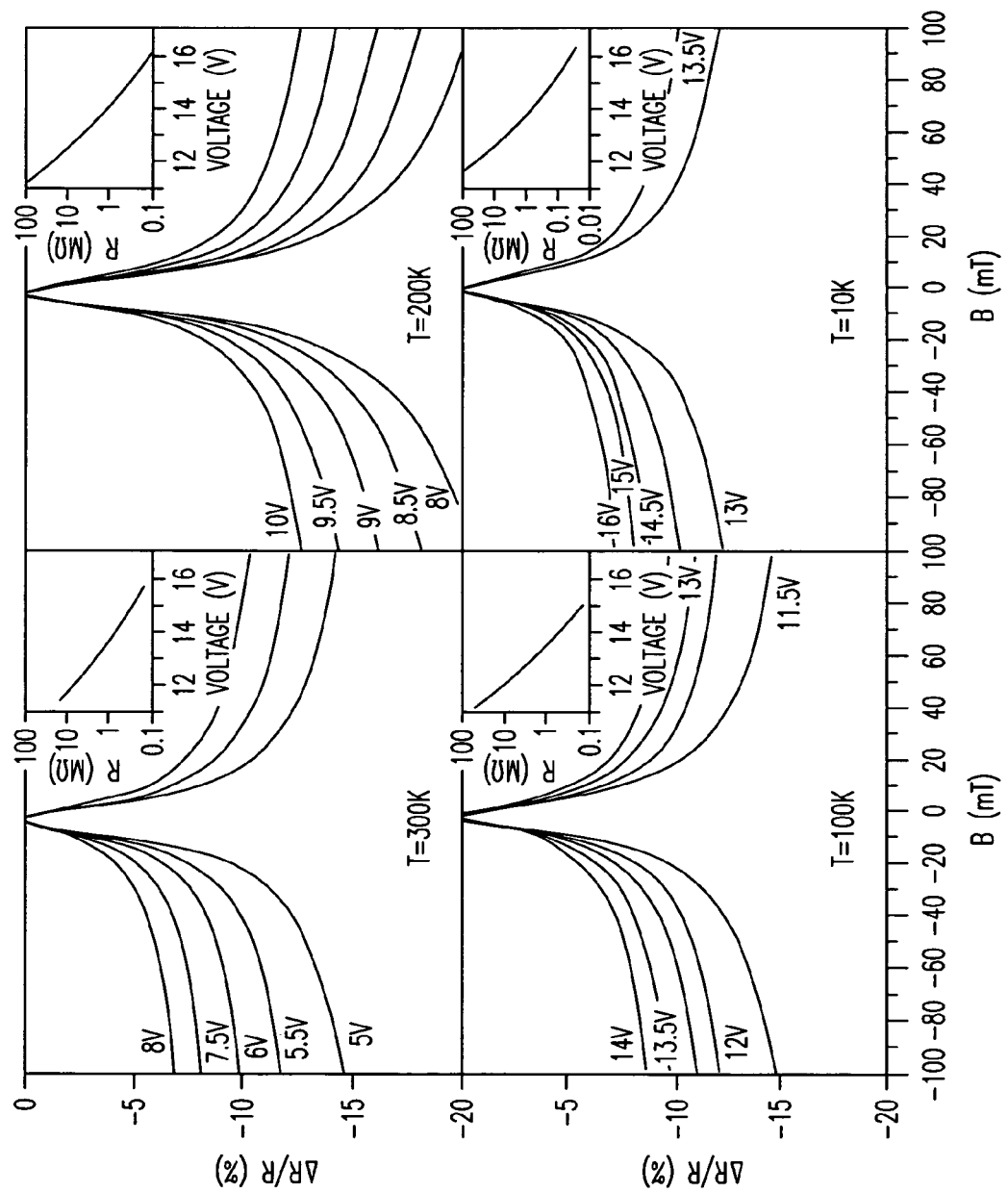
FIG. 22 is a plot illustrating the magneto resistance response, ΔR/R curves, of an ITO/PEDOT/PFO (100 nm)/Ca device measured at different temperatures, namely 10 K, 100 K, 200 K, and 300 K. The applied voltages are assigned. The inset graph shows the trend in device resistance as a function of the applied voltage.

Additional FIG. 22 depicts the MR traces of a magneto resistive device (ITO/PEDOT/PFO (100 nm)/Ca) as a function of temperature. It can be seen that the MR effect is observed at all temperatures spanning the range between 10K and 300K indicating that the magnitude and width of the MR effect is at least substantially insensitive to surrounding temperature profiles.

The detecting means described herein includes means for controlling the exemplified system and performing data processing operations, and can include, for example, a data processing pipeline and/or a processor. A processing pipeline may consist of preamplifiers such as the National Semiconductor CLC5509, filters such as the Linear Technology LTC1061, amplifiers and buffers such as the Texas Instruments uA741, and analog to digital (A/D) converters ranging in precision such as the Analog Devices AD747X series or the AD778X series. The processor may be a microcontroller such as a Microchip PIC16F87X or a Motorola 68HC11, a microprocessor such as an Intel Pentium, or similar logic hardware such as an FPGA. The processing pipelines and processor may be discrete components in various packages such as dual in line (DIP), small outline integrated circuit (SOIC), plastic leaded chip carrier (PLCC), or pin grid array(PGA). The discrete components may be interconnected on a printed circuit board which would be external to the MR devices. A further implementation of the processing pipeline and/or processor would involve an application specific integrated circuit (ASIC) customized for individual applications. An even more specific implementation of a processing pipeline and/or processor would involve fabrication of electronic components directly into a semiconductor substrate on which the MR devices reside. Persons skilled in the art to which the invention pertains will, in view of the description above of the device, system or method illustrated in the accompanying figures, understand that a suitable processor executes program code in software or firmware that enables it to manipulate data in memory and effect the magneto resistive detection as described in the various embodiments described herein. In view of the description above, such persons will readily be capable of providing and configuring a suitable system of hardware, software, firmware or some combination thereof that affects such steps.

It should be understood that the arrangement or architecture of the illustrated device and system, as well as the sequence of method steps, are exemplary, and others will occur readily to persons skilled in the art in view of the teachings in this patent specification. In other embodiments, the system can have more or fewer elements, and the method can have more or fewer steps. Furthermore, it should be understood that the functions of elements can be separated, combined, or otherwise distributed over a group of elements in a manner different from that described in this exemplary embodiment of the invention.

It will be apparent to those skilled in the art that various modifications and variations can be made in the present invention without departing from the scope or spirit of the invention. Other embodiments of the invention will be apparent to those skilled in the art from consideration of the specification and practice of the invention disclosed herein.

What is claimed is:

1. A display device, comprising:
a plurality of magnetoresistive elements, wherein each of the plurality of magnetoresistive elements comprises a first electrode, a second electrode, and a semi conductive organic layer disposed between the first and second electrodes; and
a detection circuit that detects the presence of a magnetic field among one or more of the plurality of magnetoresistive elements.

2. The display device of claim 1, further comprising a predetermined matrix of pixels.

3. The display device of claim 2, wherein the display device is a touch screen.

4. The display device of claim 2, wherein the plurality of magneto resistive elements are positioned in a matrix.

5. The display device of claim 4, wherein the matrix is a two-dimensional matrix.

6. The display device of claim 4, wherein each magneto resistive element is positioned in registration with a plurality of pixels of the matrix of pixels.

7. The display device of claim 4, wherein a plurality of the plurality of magneto resistive elements is positioned in registration with one pixel of the matrix of pixels.

8. The display device of claim 4, wherein each magneto resistive element is positioned in registration with one pixel of the matrix of pixels.

9. The display device of claim 4, wherein at least one magneto resistive element is a display pixel.

10. The display device of claim 8, wherein each magneto resistive element is positioned adjacent one pixel of the matrix of pixels.

11. The display device of claim 8, wherein each magneto resistive element underlies the plurality of pixels.

12. The display device of claim 8, wherein each magneto resistive element overlies the plurality of pixels.

13. The display device of claim 1, wherein the detection circuit is capable of detecting which of the one or more of the plurality of magnetoresistive elements is in the presence of a magnetic field.

14. The display device of claim 1, wherein the detection circuit can detect the presence and strength of a magnetic field among one or more of the plurality of magnetoresistive elements.

* * * * *